United States Patent
Fujihara et al.

(10) Patent No.: US 8,754,186 B2
(45) Date of Patent: Jun. 17, 2014

(54) POLYIMIDE PRECURSOR COMPOSITION, USE THEREOF AND PRODUCTION METHOD THEREOF

(75) Inventors: Kan Fujihara, Otsu (JP); Tetsuya Kogiso, Otsu (JP); Yoshihide Sekito, Otsu (JP)

(73) Assignee: Kaneka Corporation, Osaka (JP)

( * ) Notice: Subject to any disclaimer, the term of this patent is extended or adjusted under 35 U.S.C. 154(b) by 1019 days.

(21) Appl. No.: 12/521,205

(22) PCT Filed: Dec. 19, 2007

(86) PCT No.: PCT/JP2007/074392
§ 371 (c)(1),
(2), (4) Date: Jun. 25, 2009

(87) PCT Pub. No.: WO2008/078620
PCT Pub. Date: Jul. 3, 2008

(65) Prior Publication Data
US 2010/0084171 A1      Apr. 8, 2010

(30) Foreign Application Priority Data

Dec. 26, 2006  (JP) ................................ 2006-348775
Jan. 29, 2007  (JP) ................................ 2007-017864
Feb. 7, 2007  (JP) ................................ 2007-028406

(51) Int. Cl.
*C08G 69/26*  (2006.01)

(52) U.S. Cl.
USPC ........... 528/353; 528/125; 528/126; 528/128; 528/170; 528/172; 528/173; 528/310

(58) Field of Classification Search
USPC .......... 528/125, 126, 128, 170, 172, 173, 310
See application file for complete search history.

(56) References Cited

U.S. PATENT DOCUMENTS

| | | | |
|---|---|---|---|
| 5,202,411 A * | 4/1993 | Itatani ........................ | 528/353 |
| 6,133,407 A | 10/2000 | Kaneshiro et al. | |
| 6,333,391 B1 * | 12/2001 | Laycock et al. ............. | 528/170 |
| 2006/0063908 A1 | 3/2006 | Moriuchi et al. | |

FOREIGN PATENT DOCUMENTS

| | | |
|---|---|---|
| JP | 4-114035 | 4/1992 |
| JP | 11-209609 | 8/1999 |
| JP | 11-217502 | 8/1999 |
| JP | 2000-212446 | 8/2000 |
| JP | 2000-234023 | 8/2000 |
| JP | 2000-319389 | 11/2000 |
| JP | 2000-319391 | 11/2000 |
| JP | 2001-31764 | 2/2001 |
| JP | 2001-89656 | 4/2001 |
| JP | 2001-125273 | 5/2001 |
| JP | 2001-163974 | 6/2001 |
| JP | 2001-215702 | 8/2001 |

OTHER PUBLICATIONS

International Search Report issued in International Application No. PCT/JP2007/074392 and mailed Jan. 29, 2008—1 page.
English translation of the Written Opinion of the International Searching Authority issued in International Application No. PCT/JP2007/074392 and mailed Jan. 29, 2008—3 pages.
English translation of the International Preliminary Report on Patentability issued in International Application No. PCT/JP2007/074392 and mailed Jun. 30, 2009—2 pages.

* cited by examiner

*Primary Examiner* — Gregory Listvoyb
(74) *Attorney, Agent, or Firm* — Hamre, Schumann, Mueller & Larson, P.C.

(57) ABSTRACT

An object of the present invention is to provide a polyimide precursor composition that can be cured at low temperatures (250° C. or lower), while having a low viscosity even at a high concentration, and a method of producing the same. Another object of the present invention is to provide a polyimide coating film obtained from the polyimide precursor composition and having good physical properties, and a method of producing the same. Furthermore, another object of the present invention is to provide a photosensitive resin composition containing the polyimide precursor composition, and a method of producing the same. These objects can be achieved by the polyimide precursor composition containing an imidized tetracarboxylic acid having a specific structure and a diamine having a specific structure.

14 Claims, No Drawings

POLYIMIDE PRECURSOR COMPOSITION, USE THEREOF AND PRODUCTION METHOD THEREOF

TECHNICAL FIELD

The present invention relates to a polyimide precursor composition that can be cured at low temperatures of 250° C. or lower and that has good long-term storage stability; a method of producing the same; furthermore, a polyimide precursor solution, a polyimide coating film, and a photosensitive resin composition that are obtained from the polyimide precursor composition; and methods of producing the same.

BACKGROUND ART

Polyimide resins are excellent in heat resistance, electrical insulation properties, and chemical resistance, have good mechanical properties, and thus are used in electrical/electronic applications. For example, polyimide resins are used as an insulating film or a protective coating agent on a semiconductor device; and a surface protection material or a base resin for a flexible circuit board, an integrated circuit, or the like; and furthermore, they are used in a case where an interlayer insulation film or a protective film of fine circuits are formed. In particular, in the case where a polyimide resin is used as a coating material, a protective material in which a formed body such as a polyimide film is bonded using an adhesive, a liquid polyimide resin solution, and the like have been used.

Polyimide resin solutions are broadly divided into two types of solution. One type of solution is a polyamic acid solution, which is a precursor of a polyimide resin. The other type of solution is a solution of a polyimide resin which is soluble in an organic solvent. However, the polyamic acid solution and polyimide resin solution are polymer solutions of a high-molecular-weight product, which has a high molecular weight and low solubility, and thus it is impossible to adjust the concentration of a solute to be high. Accordingly, for example, when a coating film is formed, it is necessary to volatilize a large amount of solvent, resulting in a problem of low productivity. Furthermore, in the case where a precursor solution of a polyimide resin is formed into a coating film, it is necessary to perform imidization, and the imidization must be performed at a heating temperature higher than 300° C. Therefore, for example, when such a polyimide resin precursor solution is used as a protective agent of a flexible substrate or the like, an adhesive of a formed body, or the like, a problem that a wiring material cannot withstand high temperatures, or the like occurs. Accordingly, a resin that can be cured at low temperatures (250° C. or lower), at which degradation of wiring does not occur, has been desired.

Regarding techniques of these polyimide resin solutions, a polyimide precursor solution in which a tetracarboxylic acid or a diester acid derivative thereof, and a diamine are dissolved and which has a high concentration and a low viscosity has been proposed (refer to, for example, Patent Documents 1 to 4).

A polyimide precursor solution in which a carboxylic acid having an amide bond in its structure and a diamine are dissolved and which has a high concentration and a low viscosity has also been proposed (refer to, for example, Patent Documents 5 to 7).

Furthermore, a photosensitive resin composition or a plasma etching resist containing a terminally half-esterified imide siloxane oligomer has been proposed (refer to, for example, Patent Documents 8 to 11).

Patent Document 1: Japanese Unexamined Patent Application Publication No. 11-209609
Patent Document 2: Japanese Unexamined Patent Application Publication No. 11-217502
Patent Document 3: Japanese Unexamined Patent Application Publication No. 2000-319389
Patent Document 4: Japanese Unexamined Patent Application Publication No. 2000-319391
Patent Document 5: Japanese Unexamined Patent Application Publication No. 2001-31764
Patent Document 6: Japanese Unexamined Patent Application Publication No. 2001-163974
Patent Document 7: Japanese Unexamined Patent Application Publication No. 2000-234023
Patent Document 8: Japanese Unexamined Patent Application Publication No. 2000-212446
Patent Document 9: Japanese Unexamined Patent Application Publication No. 2001-89656
Patent Document 10: Japanese Unexamined Patent Application Publication No. 2001-125273
Patent Document 11: Japanese Unexamined Patent Application Publication No. 2001-215702

DISCLOSURE OF INVENTION

Problems to be Solved by the Invention

As described in the above patent documents, as a method of adjusting the concentration to be high, various methods have been proposed. However, it has become clear that the solution of a salt obtained from a tetracarboxylic acid or a diester acid derivative thereof, and a diamine described in Patent Documents 1 to 4 has a very high imidization temperature, and is not a salt solution that can be cured at low temperatures. In addition, it was found that in the case of the solution of a polyamic acid having an amide bond described in Patent Documents 5 to 7, the amide bond is cleaved, thereby degrading the stability of the solution. In particular, when a solution is prepared so as to have a high concentration, the amount of change in the solution viscosity is large, which is a problem. On the other hand, in the case where the terminally half-esterified imide siloxane oligomer described in Patent Documents 8 to 11 is used, the following problems occur. An organic molecule is eliminated from the esterified product, and therefore, the temperature for imidization is high. An alcoholic eliminating substance is not readily volatilized from a polyimide coating film, which may cause foaming or the like.

In view of the above situation, it is an object of the present invention to provide a polyimide precursor solution that can be cured at low temperatures (250° C. or lower), while having a low viscosity even at a high concentration, a method of producing the same, a polyimide coating film and photosensitive resin composition obtained from the polyimide precursor solution and having good physical properties, and methods of producing the same.

Means for Solving the Problems

As a result of intensive studies to solve the above problems, the inventors of the present invention have found that a polyimide coating film that can be cured at low temperatures and that has good physical properties can be obtained from a composition containing an imidized tetracarboxylic acid and a diamine. More specifically, it was found that a polyimide precursor composition containing an imidized tetracarboxylic acid represented by general formula (1) and a diamine represented by general formula (2) which will be described below has a low viscosity, though a solute is dissolved at a high concentration when the polyimide precursor composition is formed into a solution, and that a polyimide coating film having a high strength can be obtained from this solution.

The present invention has been made on the basis of these findings. According to the present invention, the above problems can be solved by a polyimide resin precursor composition having the following novel configuration.

Specifically, the present invention provides a polyimide precursor composition containing:

at least an imidized tetracarboxylic acid represented by general formula (1) below:

[Chem. 1]

General formula (1)

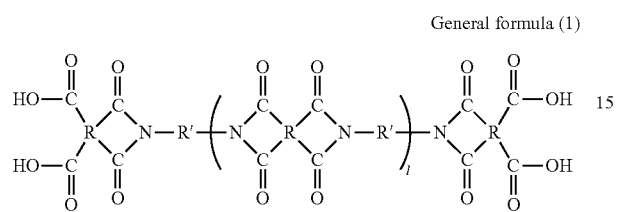

(wherein Rs each independently represent a tetravalent organic group, R's each independently represent a divalent organic group, and l represents an integer of 0 to 20); and a diamine represented by general formula (2) below:
[Chem. 2]

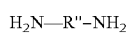 General formula (2)

(wherein R" represents a divalent organic group.)

Each of Rs in general formula (1) above is preferably a tetravalent organic group selected from general formula group (1) below:

[Chem. 3]

General formula group (1)

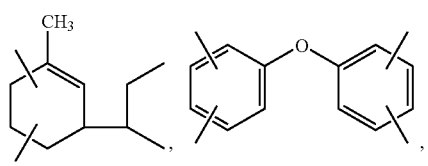

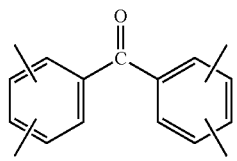

Preferably, each of R's in general formula (1) above at least includes a divalent organic group represented by general formula group (2) below:

[Chem. 4]

General formula group (2)

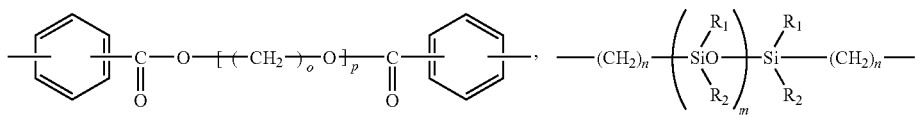

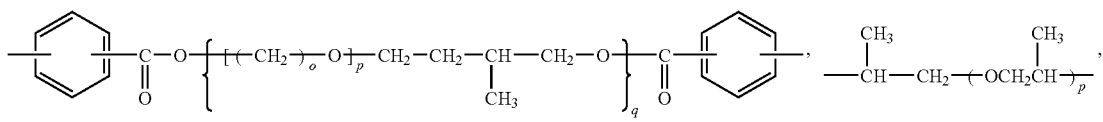

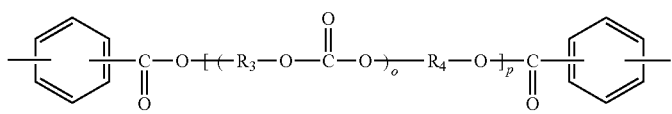

(wherein o, p, and q each independently represent an integer of 1 to 30, $R_1$ and $R_2$ each independently represent an alkyl group having 1 to 12 carbon atoms or an aromatic group, m represents an integer of 1 to 40, n represents an integer of 1 to 20, and $R_3$ and $R_4$ each independently represent an alkyl group having 1 to 12 carbon atoms.)

In addition, R" in general formula (2) above is preferably a divalent organic group selected from general formula group (3) below:

[Chem. 5]

General formula group (3)

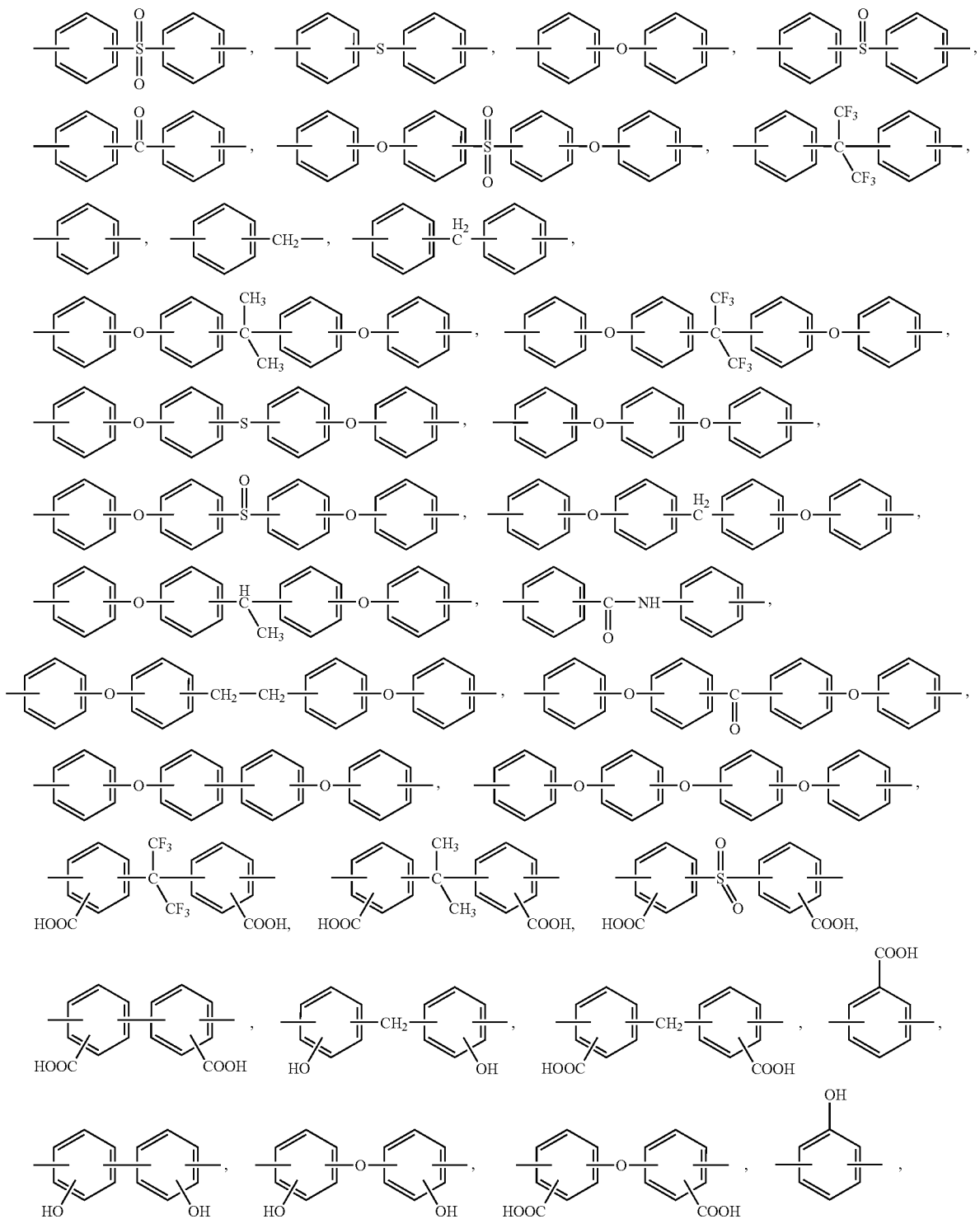

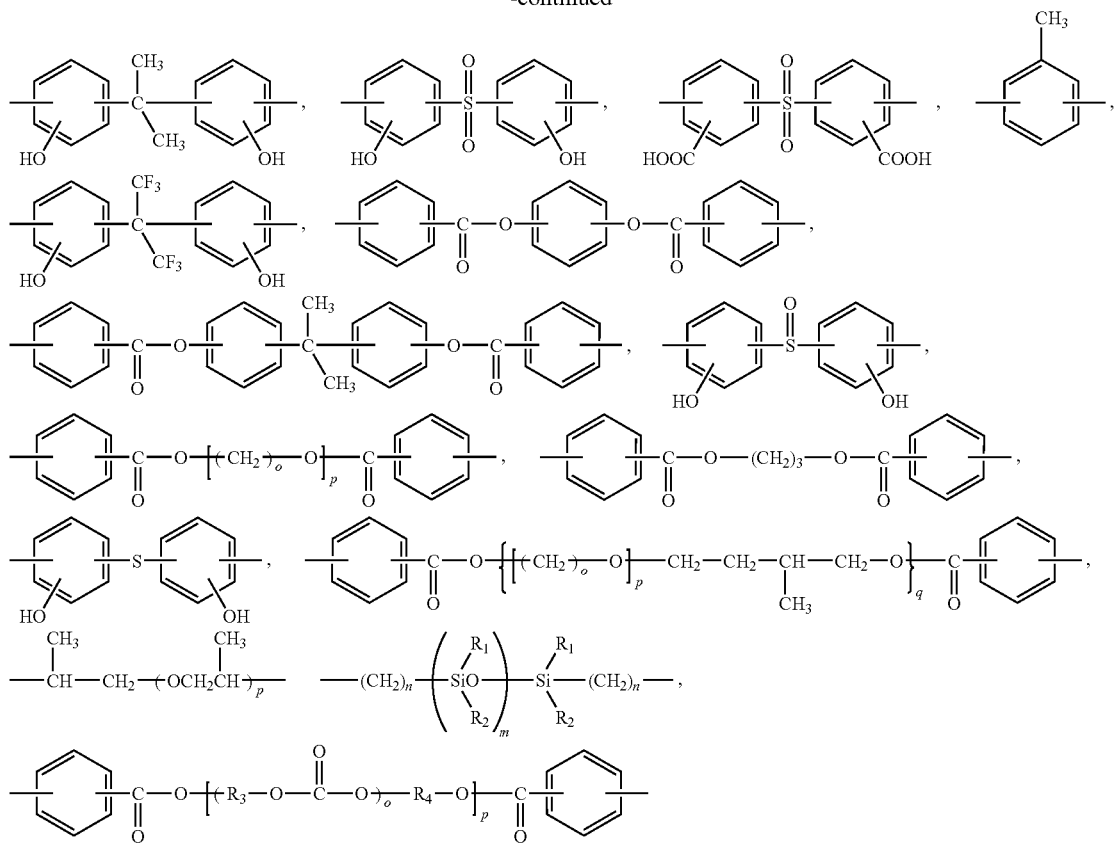

(wherein o, p, and q each independently represent an integer of 1 to 30, $R_1$ and $R_2$ each independently represent an alkyl group having 1 to 12 carbon atoms or an aromatic group, m represents an integer of 1 to 40, n represents an integer of 1 to 20, and $R_3$ and $R_4$ each independently represent an alkyl group having 1 to 12 carbon atoms.)

Another invention of the present invention provides a polyimide precursor composition solution produced by dissolving the polyimide precursor composition so that a solute concentration is 40 to 90 weight percent.

Furthermore, another invention of the present invention provides a polyimide coating film obtained from the polyimide precursor composition or the polyimide precursor composition solution.

Furthermore, another invention of the present invention provides a printed wiring board having a polyimide coating film, the printed wiring board produced by coating the polyimide precursor composition or the polyimide precursor composition solution on a printed wiring board, and imidizing by heating.

Furthermore, another invention of the present invention provides a photosensitive resin composition containing the polyimide precursor composition, and at least a photosensitive resin, and a photopolymerization initiator.

Furthermore, another invention of the present invention provides a method of producing a polyimide precursor composition including the steps of:

conducting a reaction between a tetracarboxylic dianhydride represented by general formula (3) below:

[Chem. 6]

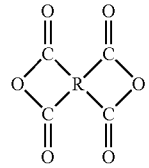

General formula (3)

(wherein R represents a tetravalent organic group), and a diamine represented by general formula (4) below:

[Chem. 7]

$$H_2N-R'-NH_2 \quad \text{General formula (4)}$$

(wherein R' represents a divalent organic group) in a ratio in which the diamine represented by general formula (4) is 0.20 to 0.80 moles relative to 1 mole of the tetracarboxylic dianhydride represented by general formula (3) to prepare an amic acid;

imidizing the amic acid to prepare an imide; and reacting the imide with water to prepare an imidized tetracarboxylic acid the inner part of which is imidized and each terminal of which has a tetracarboxylic acid structure, wherein the method further includes a step of mixing the imidized tetracarboxylic acid prepared in the above step with a diamine represented by general formula (2) below:

[Chem. 8]

$$H_2N-R''-NH_2 \quad \text{General formula (2)}$$

(wherein R" represents a divalent organic group) in a ratio in which the total of the diamine represented by general formula (2) and the diamine represented by general formula (4) used in the step of preparing the amic acid is 0.70 to 1.30 moles relative to 1 mole of the imidized tetracarboxylic acid.

Preferably, the diamine represented by general formula (4) at least includes a diamine represented by general formula group (4) below:

[Chem. 9]

General formula group (4)

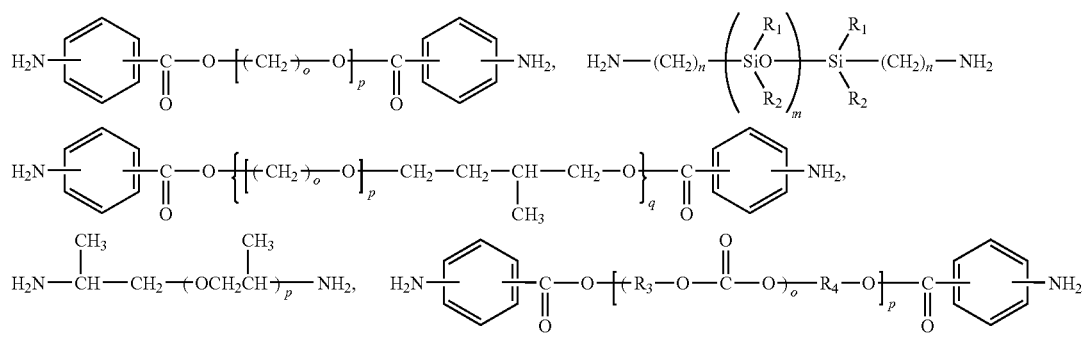

(wherein o, p, and q each independently represent an integer of 1 to 30, $R_1$ and $R_2$ each independently represent an alkyl group having 1 to 12 carbon atoms or an aromatic group, m represents an integer of 1 to 40, n represents an integer of 1 to 20, and $R_3$ and $R_4$ each independently represent an alkyl group having 1 to 12 carbon atoms.)

Another invention of the present invention provides a method of producing a polyimide precursor composition solution including a step of dissolving the polyimide precursor composition produced by the above production method in an organic solvent so that a solute concentration is 40 to 90 weight percent.

Furthermore, another invention of the present invention provides a method of producing a polyimide coating film including a step of obtaining a polyimide coating film from the polyimide precursor composition or the polyimide precursor composition solution produced by the above production method.

Furthermore, another invention of the present invention provides a method of producing a printed wiring board having a polyimide coating film, the method including the steps of coating the polyimide precursor composition or the polyimide precursor composition solution produced by the above production method on a printed wiring board, and imidizing by heating.

Furthermore, another invention of the present invention provides a method of producing a photosensitive resin composition including a step of mixing the polyimide precursor composition produced by the above production method with at least a photosensitive resin, and a photopolymerization initiator.

ADVANTAGES

According to the polyimide precursor composition of the present invention, when the composition is dissolved in an organic solvent, the resulting solution has a low viscosity though a solute is dissolved at a high concentration. In addition, the polyimide coating film obtained from the polyimide precursor composition of the present invention is excellent in adhesiveness of the coating film, stability in an environmental resistance test, chemical resistance, and flexibility and has good physical properties. Accordingly, the polyimide precursor composition of the present invention can be used as a protective film of various wiring substrates, or the like, and thus provides good advantages. The photosensitive resin composition containing the polyimide precursor composition of the present invention can be cured at low temperatures and exhibits various good properties when applied/formed on a wiring board. According to the method of producing a polyimide precursor composition of the present invention, a polyimide precursor solution in which a solute is dissolved at a high concentration and which has a low viscosity can be easily produced. According to the method of producing a polyimide coating film of the present invention, a polyimide coating film can be easily produced. Furthermore, according to the method of producing a photosensitive resin composition of the present invention, a photosensitive resin composition having various good properties can be produced.

BEST MODES FOR CARRYING OUT THE INVENTION

The present invention will now be described in derail. A polyimide precursor composition of the present invention contains at least an imidized tetracarboxylic acid represented by general formula (1) below:

[Chem. 10]

General formula (1)

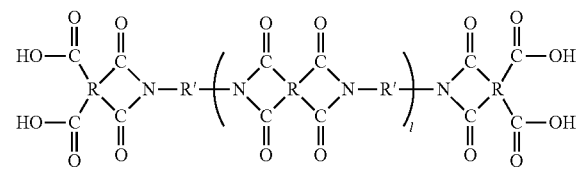

(wherein Rs each independently represent a tetravalent organic group, R's each independently represent a divalent organic group, and l represents an integer of 0 to 20), and a diamine represented by general formula (2) below:
[Chem. 11]

$H_2N\text{---''---}NH_2$

General formula (2)

(wherein R" represents a divalent organic group.)

The polyimide precursor composition of the invention of this application means a composition which contains the structures of general formulae (1) and (2) above, but in which the structures do not have a covalent bond. That is, general polyimide precursor compositions mean, for example, polymers in which general formulae (1) and (2) above are partially covalently bonded with amide bonds, whereas the polyimide precursor composition of the invention of this application means a composition in which general formulae (1) and (2) do not have a covalent bond. In such a polyimide precursor composition having no covalent bond as described above, the concentration of a solution in which general formulae (1) and (2) above are dissolved can be increased, and a change in the viscosity of the solution (change in the molecular weight) can be suppressed.

<Imidized Tetracarboxylic Acid>

The imidized tetracarboxylic acid is a tetracarboxylic acid which has at least two imide bonds in its structural formula and each terminal of which has a tetracarboxylic acid structure, as shown in general formula (1) below:

[Chem. 12]

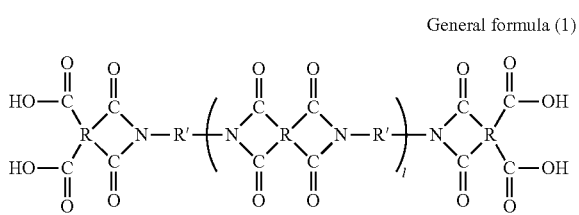

General formula (1)

(wherein R's each independently represent a tetravalent organic group, R's each independently represent a divalent organic group, and l represents an integer of 0 to 20.) The imidized tetracarboxylic acid of the invention of this application preferably has a molecular weight as low as possible because the solubility in an organic solvent solution is improved. For example, polymerized products having relatively low molecular weights, which are called oligomers, are preferable. In such a tetracarboxylic acid structure, although the tetracarboxylic acid has been imidized, the solubility in a solvent can be increased. Furthermore, since the bonds in the structure are not amide bonds but imide bonds, the storage stability is good. Therefore, when a solution of the polyimide precursor composition is prepared, the degradation of the solution viscosity over time can be prevented to suppress a change in the viscosity.

In particular, each of Rs in general formula (1) preferably has a structure selected from general formula group (1) below:

[Chem. 13]

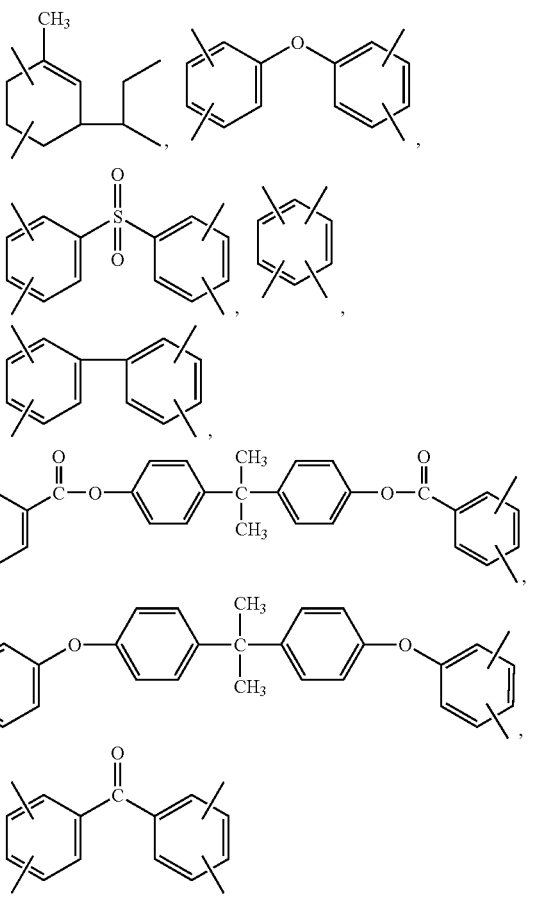

General formula group (1)

In particular, the structure selected from general formula group (1) above is preferable because the solubility of the tetracarboxylic acid in an organic solvent is increased, and thus the concentration can be increased when a solution of the polyimide precursor is prepared.

Furthermore, preferably, each of R's in general formula (1) has at least a divalent organic group selected from general formula group (2) below:

[Chem. 14]

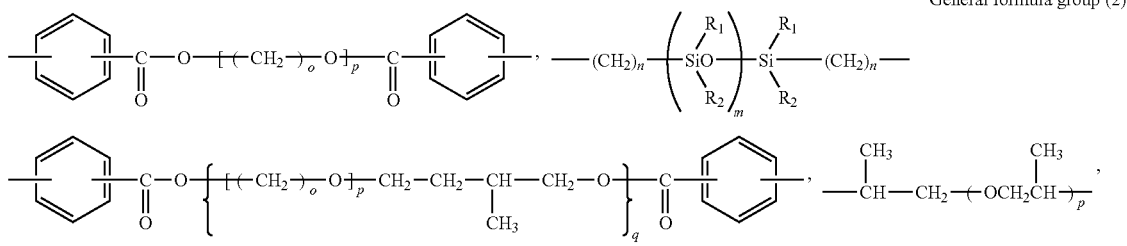

General formula group (2)

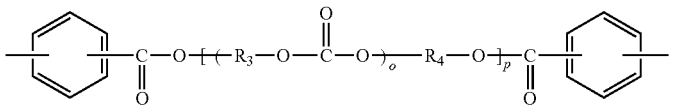

In order to obtain the structure of general formula (1) above, a tetracarboxylic dianhydride represented by general formula (3) below is reacted with a diamine represented by general formula (4) below:

[Chem. 15]

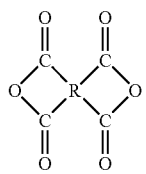

General formula (3)

(wherein R represents a tetravalent organic group)

[Chem. 16]

$$H_2N—R'—NH_2$$  General formula (4)

(wherein R' represents a divalent organic group.)

More specifically, as the tetracarboxylic dianhydride represented by general formula (3) above, 3,3',4,4'-benzophenonetetracarboxylic dianhydride, pyromellitic dianhydride, 3,3',4,4'-oxydiphthalic dianhydride, 2,2-bis[4-(3,4-dicarboxyphenoxy)phenyl]propane dianhydride, 2,2-bis(4-hydroxyphenyl)propanedibenzoate-3,3',4,4'-tetracarboxylic dianhydride, 3,3',4,4'-diphenylsulfone tetracarboxylic dianhydride, 3,3',4,4'-biphenyltetracarboxylic dianhydride, 2,3,3',4-biphenyltetracarboxylic dianhydride, or 5-(2,5-dioxotetrahydro-3-furanyl)-3-methyl-3-cyclohexene-1,2-dicarboxylic anhydride is preferably used, and particularly preferably, 2,2-bis[4-(3,4-dicarboxyphenoxy)phenyl]propane dianhydride, 3,3',4,4'-diphenylsulfone tetracarboxylic dianhydride, 3,3',4,4'-oxydiphthalic dianhydride, or 5-(2,5-dioxotetrahydro-3-furanyl)-3-methyl-3-cyclohexene-1,2-dicarboxylic anhydride is used from the standpoint that the solubility of the polyimide precursor is improved, and chemical resistance of the resulting polyimide resin is improved. Among these, in particular, 2,2-bis[4-(3,4-dicarboxyphenoxy)phenyl]propane dianhydride is preferably used from the standpoint that the solubility is improved to improve characteristics of the resulting film.

As the diamine represented by general formula (4), more specifically, R' preferably has a structure containing at least a divalent organic group selected from general formula group (2) below:

[Chem. 17]

General formula group (2)

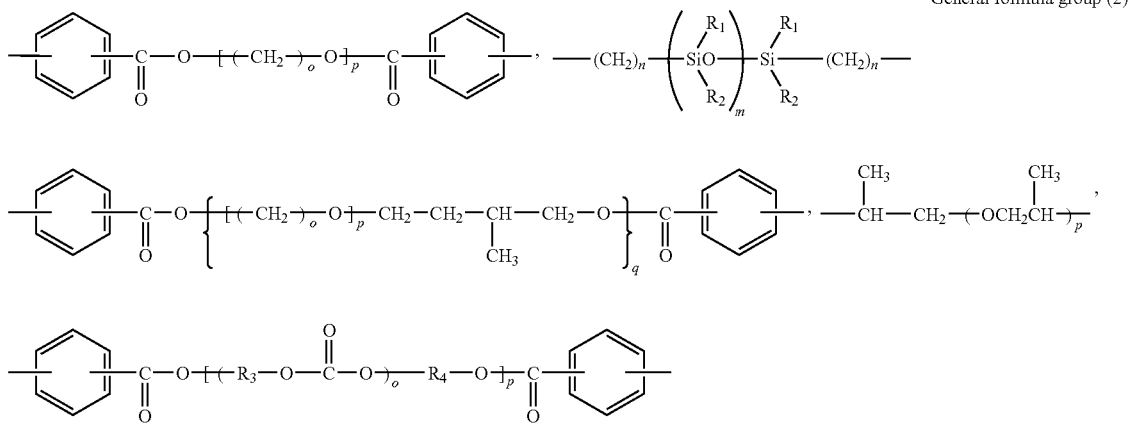

(wherein o, p, and q each independently represent an integer of 1 to 30, $R_1$ and $R_2$ each independently represent an alkyl group having 1 to 12 carbon atoms or an aromatic group, m represents an integer of 1 to 40, n represents an integer of 1 to 20, and $R_3$ and $R_4$ each independently represent an alkyl group having 1 to 12 carbon atoms.)

In the case where the above structural skeleton is contained, when a polyimide resin is formed, flexibility can be imparted to a coating film of the polyimide resin, and in addition, the imidization temperature during the formation of the polyimide resin can be decreased. By using this structural skeleton in combination, the imidization temperature of the polyimide resin can be more readily decreased to 250° C. or lower.

Particularly preferable structures of R' include general formula group (5) below:

[Chem. 18]

General formula group (5)

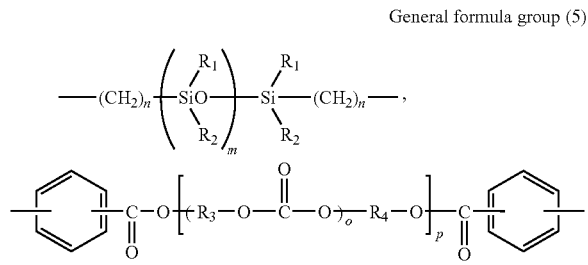

(wherein $R_1$ and $R_2$ each independently represent an alkyl group having 1 to 12 carbon atoms or an aromatic group, m represents an integer of 1 to 40, n represents an integer of 1 to 20, m represents an integer of 1 to 40, n represents an integer of 1 to 20, and $R_3$ and $R_4$ each independently represent an alkyl group having 1 to 12 carbon atoms.)

The use of the above structure is preferable because flexibility can be imparted to a polyimide coating film, the imidization temperature can be decreased, a solute concentration can be adjusted to be high, and the adhesiveness to a base material can be improved.

In order to introduce the above structure into the structural skeleton, a long-chain diamine represented by general formula group (4) below is used:

[Chem. 19]

General formula group (4)

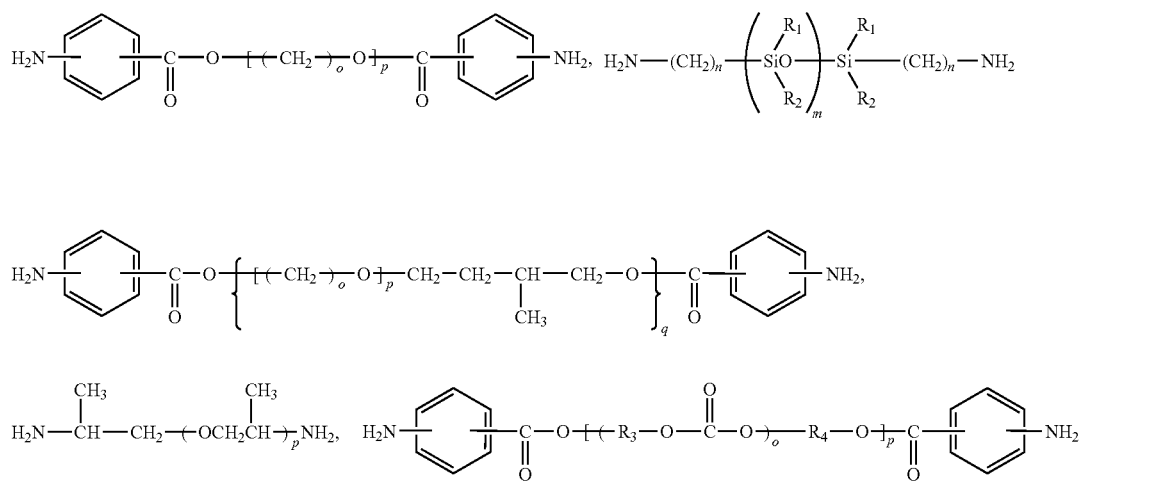

(wherein o, p, and q each independently represent an integer of 1 to 30, $R_1$ and $R_2$ each independently represent an alkyl group having 1 to 12 carbon atoms or an aromatic group, m represents an integer of 1 to 40, n represents an integer of 1 to 20, and $R_3$ and $R_4$ each independently represent an alkyl group having 1 to 12 carbon atoms.)

Among the above structures, in the case where the adhesiveness to a base material is considered, general formula group (6) below is preferable:

[Chem. 20]

General formula group (6)

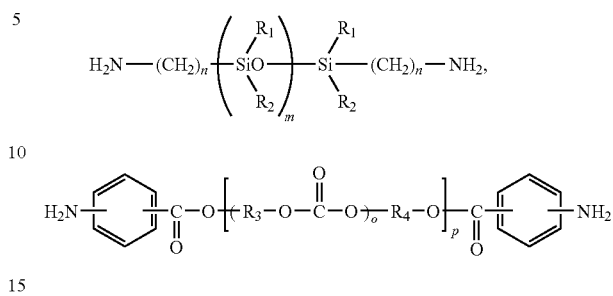

(wherein o and p each independently represent an integer of 1 to 30, $R_1$ and $R_2$ each independently represent an alkyl group having 1 to 12 carbon atoms or an aromatic group, m represents an integer of 1 to 40, n represents an integer of 1 to 20, and $R_3$ and $R_4$ each independently represent an alkyl group having 1 to 12 carbon atoms.)

In particular, as for the structure of a silicon diamine used in the invention of this application, each of $R_1$ and $R_2$ is preferably a methyl group, an ethyl group, or a phenyl group, m is preferably 1 to 40, and n is preferably 2 or more. When such a structure is used, a solute can be dissolved in a high concentration.

In addition, a structure in which $R_3$ is a heptamethylene group, a hexamethylene group, a pentamethylene group, a tetramethylene group, or a trimethylene group, and each of o and p is independently an integer of 1 to 30 is preferably used.

Such a structure is preferable because flexibility can be imparted to a polyimide resin and adhesiveness to a base material is improved.

Note that, in producing the imidized tetracarboxylic acid, a diamine represented by general formula (5) may be used in combination, as required.

[Chem. 21]
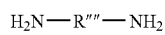
General formula (5)
(wherein R'''' represents a divalent organic group.)
In addition, as for the diamine represented by general formula (5), more specifically, R'''' has a structure containing at least a divalent organic group selected from general formula group (7) below:
[Chem.22]
General formula group (7)
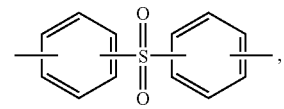
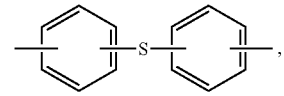
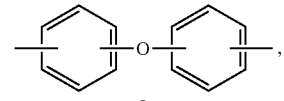
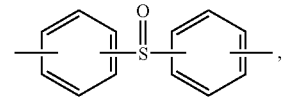
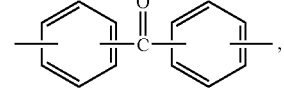
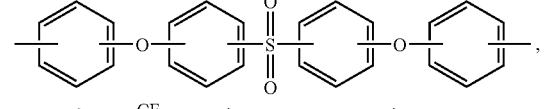
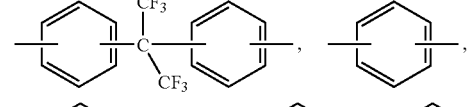
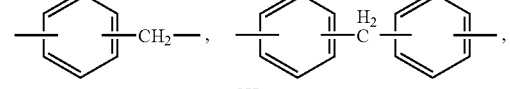
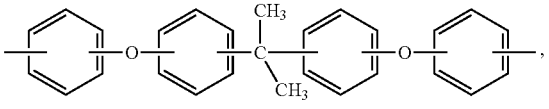
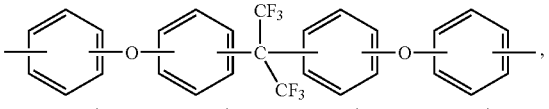
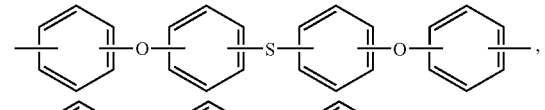
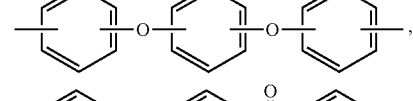
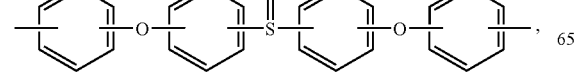
-continued
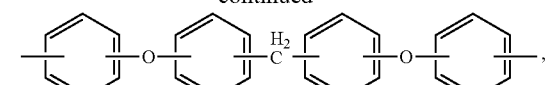
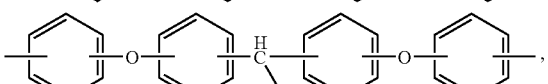
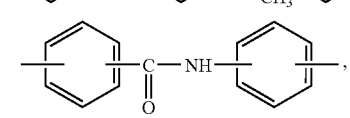
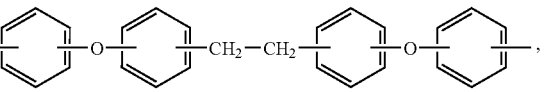
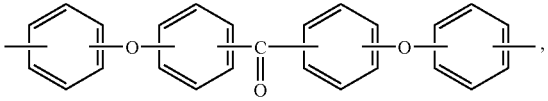
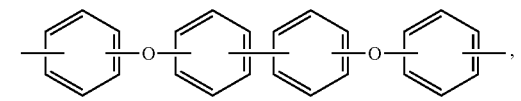
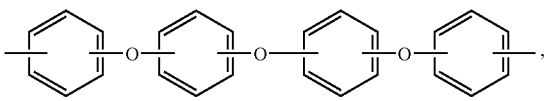
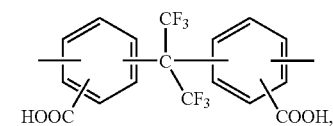
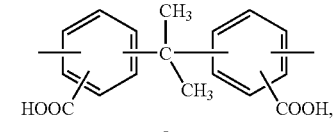
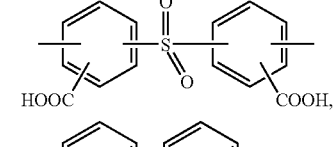
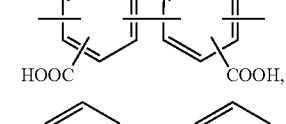
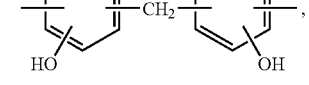
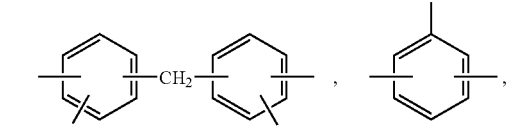
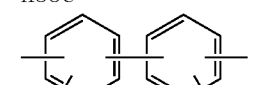
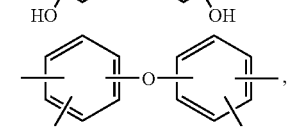

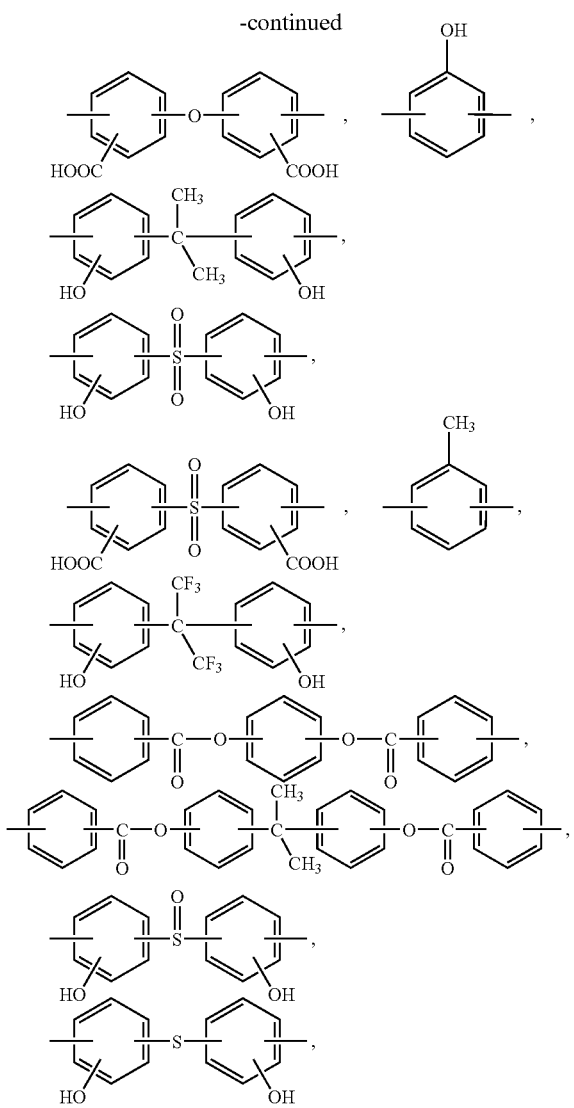

Regarding the amount of use in combination, in the case where the number of moles of the diamine of general formula (4) is assumed to be 1, the diamine of general formula (5) is preferably 1.0 or less, more preferably 0.8 or less, and particularly preferably 0.5 or less because the solubility of the imidized tetracarboxylic acid of general formula (1) in an organic solvent can be increased, and imidization can be performed at a low imidization temperature.

<Method of Producing Imidized Tetracarboxylic Acid>

Various methods can be cited as a method of producing the partially imidized tetracarboxylic acid.

Method 1: A diamine represented by general formula (4) or diamines represented by general formula (4) and general formula (5) are added to a solution prepared by dispersing or dissolving a tetracarboxylic dianhydride represented by general formula (3) in an organic solvent, and the resulting mixture is reacted to prepare a polyamic acid solution. In this step, the diamine or diamines are added so that the total amount thereof is in the range of 0.20 to 0.80 moles relative to 1 mole of the tetracarboxylic dianhydride. After the reaction between the tetracarboxylic dianhydride and the diamine or diamines is completed, the resulting polyamic acid solution is heated to 100° C. or higher and 300° C. or lower, more preferably 150° C. or higher and 250° C. or lower to perform imidization.

Furthermore, in order to open terminal anhydride rings, water is added to the resulting polyimide resin solution, and the mixture is heated at 40° C. or higher and 200° C. or lower, more preferably 60° C. or higher and 150° C. or lower. Consequently, the carboxylic anhydrides at both terminals are opened, and thus a partially imidized polyimide resin can be produced. As a solvent used in this method, a solvent that can be heated to the glass transition temperature of the polyimide resin or higher is preferably used, and particularly preferably, a solvent that can be heated to a temperature 30° C. higher than the glass transition temperature is used.

Method 2: A diamine represented by general formula (4) or diamines represented by general formula (4) and general formula (5) are added to a solution prepared by dispersing or dissolving a tetracarboxylic dianhydride represented by general formula (3) in an organic solvent, and the resulting mixture is reacted to prepare a polyamic acid solution. In this step, the diamine or diamines are added so that the amount thereof is in the range of 0.20 to 0.80 moles relative to 1 mole of the tetracarboxylic dianhydride to prepare the polyamic acid solution. A catalyst for imidization (preferably, a tertiary amine such as pyridine, picoline, isoquinoline, trimethylamine, triethylamine, or tributylamine is used) and a dehydrating agent (such as acetic anhydride) are added to the polyamic acid solution. The resulting mixture is heated to 60° C. or higher and 180° C. or lower to perform imidization. Water is added to the solution after imidization or the solution after imidization is added to water, thereby precipitating the resulting product in the form of a solid. The precipitate is filtered and dried. Thus, an imidized tetracarboxylic acid can be produced.

Method 3: A diamine represented by general formula (4) or diamines represented by general formula (4) and general formula (5) are added to a solution prepared by dispersing or dissolving a tetracarboxylic dianhydride represented by general formula (3) in an organic solvent, and the resulting mixture is reacted to prepare a polyamic acid solution. In this step, the diamine or diamines are added so that the amount thereof is in the range of 0.20 to 0.80 moles relative to 1 mole of the tetracarboxylic dianhydride to prepare the polyamic acid solution. The polyamic acid solution is placed in a vacuum oven heated at 100° C. or higher and 250° C. or lower, and air is evacuated while heating and drying are performed, thus performing imidization. The resulting imidized resin is heated in water to open terminal anhydride rings. Thus, a tetracarboxylic acid can be produced.

The methods described above are preferably employed, but the method is not limited to the above methods. Any method may be employed as long as an imidized tetracarboxylic acid in which terminal acid anhydride groups are opened and the center of the tetracarboxylic acid is imidized is produced.

In the reaction between the tetracarboxylic dianhydride represented by general formula (3) and the diamine represented by general formula (4) or the diamines represented by general formula (4) and general formula (5) for the purpose of obtaining the imidized tetracarboxylic acid represented by general formula (1), the diamine or diamines are added in an amount preferably in the range of 0.20 to 0.80 moles relative to 1 mole of the tetracarboxylic dianhydride, and more preferably in the range of 0.30 to 0.70 moles relative to 1 mole of the tetracarboxylic dianhydride. By controlling the amount within the above ranges, the molecular weight of the imidized tetracarboxylic acid represented by general formula (1) can be controlled to be low, and an imidized tetracarboxylic acid having a high solubility in an organic solvent can be efficiently produced.

In order to completely open the terminal acid dianhydride groups, in the final step of producing the imidized tetracarboxylic acid, water is added preferably in an amount of 1.5-fold or more, and more preferably in an amount of 2.0-fold or more of the amount of terminal tetracarboxylic acid anhydride groups to open the rings. Preferably, the amount of water added is large.

In order to open rings by adding water in the system, heating is more preferable. In order to open rings more efficiently, heating is performed preferably at 30° C. or higher and 150° C. or lower, and more preferably at 40° C. or higher and 120° C. or lower. In this range, the terminal carboxylic acid anhydride groups can be efficiently opened.

Examples of the solvent that can be used in the polymerization in the invention of this application include sulfoxide solvents such as dimethyl sulfoxide and diethyl sulfoxide; formamide solvents such as N,N-dimethylformamide and N,N-diethylformamide; acetamide solvents such as N,N-dimethylacetamide and N,N-diethylacetamide; pyrrolidone solvents such as N-methyl-2-pyrrolidone and N-vinyl-2-pyrrolidone; phenolic solvents such as phenol, o-, m-, or p-cresol, xylenol, halogenated phenols, and catechol; hexamethylphosphoramide; γ-butyrolactone; symmetric glycol diethers such as methyl monoglyme (1,2-dimethoxyethane), methyl diglyme (bis(2-methoxyethyl)ether), methyl triglyme (1,2-bis(2-methoxyethoxy)ethane), methyl tetraglyme (bis[2-(2-methoxyethoxyethyl)]ether), ethyl monoglyme (1,2-diethoxyethane), ethyl diglyme (bis(2-ethoxyethyl)ether), and butyl diglyme (bis(2-butoxyethyl)ether); γ-butyrolactone; N-methyl-2-pyrrolidone; acetates such as methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (synonyms: carbitol acetate and 2-(2-butoxyethoxy)ethyl)acetate), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate; and ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripropylene glycol n-propyl ether, propylene glycol phenyl ether, dipropylene glycol dimethyl ether, 1,3-dioxolane, ethylene glycol monobutyl ether, diethylene glycol monoethyl ether, diethylene glycol monobutyl ether, and ethylene glycol monoethyl ether. Note that hexane, acetone, toluene, xylene, or the like, which has a low boiling point may be used in combination according to need.

Furthermore, the polyimide precursor composition of the invention of this application may contain a tetracarboxylic acid represented by general formula (6) below:

[Chem. 23]

General formula (6)

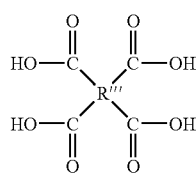

[Chem. 25]

(wherein R''' each independently represents a tetravalent organic group, however, R''' does not contain an imide ring.)

The tetracarboxylic acid represented by general formula (6) may be prepared in advance and then added to a polyimide precursor solution during preparation of the solution. Alternatively, during preparation of a solution of the partially imidized tetracarboxylic acid represented by general formula (1), by adding an excess amount of a tetracarboxylic dianhydride, the tetracarboxylic acid represented by general formula (6) above can be prepared at the same time. More specifically, in a production process of general formula (1) above, when a reaction is conducted in a ratio in which the total amount of diamine represented by general formula (4) or diamines represented by general formula (4) and general formula (5) is 0.5 moles or less relative to 1 mole of the tetracarboxylic dianhydride represented by general formula (3), the tetracarboxylic acid represented by general formula (6) above coexists in the imidized tetracarboxylic acid that is finally obtained. However, in some reaction processes, the tetracarboxylic acid represented by general formula (6) may be produced also in the case where the diamine or diamines are added in an amount of 0.5 moles or more.

As the specific example of the tetracarboxylic acid represented by general formula (6) above, preferably, 3,3',4,4'-benzophenonetetracarboxylic acid, pyromellitic acid, 3,3',4,4'-oxydiphthalic acid, 2,2-bis[4-(3,4-dicarboxyphenoxy)phenyl]propane, 2,2-bis(4-hydroxyphenyl)propanedibenzoate-3,3',4,4'-tetracarboxylic acid, 3,3',4,4'-diphenylsulfone tetracarboxylic acid, 3,3',4,4'-biphenyl tetracarboxylic acid, 2,3,3',4-biphenyl tetracarboxylic acid, or 5-(2,5-dioxotetrahydro-3-furanyl)-3-methyl-3-cyclohexene-1,2-dicarboxylic acid is used, and particularly preferably, 2,2-bis[4-(3,4-dicarboxyphenoxy)phenyl]propane, 3,3',4,4'-diphenylsulfone tetracarboxylic acid, 3,3',4,4'-oxydiphthalic acid, or 5-(2,5-dioxotetrahydro-3-furanyl)-3-methyl-3-cyclohexene-1,2-dicarboxylic acid is used. Note that R in general formula (1) above and R''' in general formula (6) above may be the same or different.

In particular, in order to decrease the solution viscosity and to decrease the final imidization temperature, 2,2-bis[4-(3,4-dicarboxyphenoxy)phenyl]propane is preferably used.

<Diamine>

In a diamine represented by general formula (2) below that can be preferably used in the invention of this application,

[Chem. 24]

$H_2N-R''-NH_2$      General formula (2)

(wherein R'' represents a divalent organic group) R'' in the formula is preferably a divalent organic group selected from general formula group (3) below:

General formula group (3)

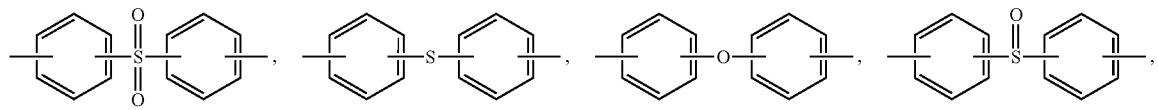

-continued
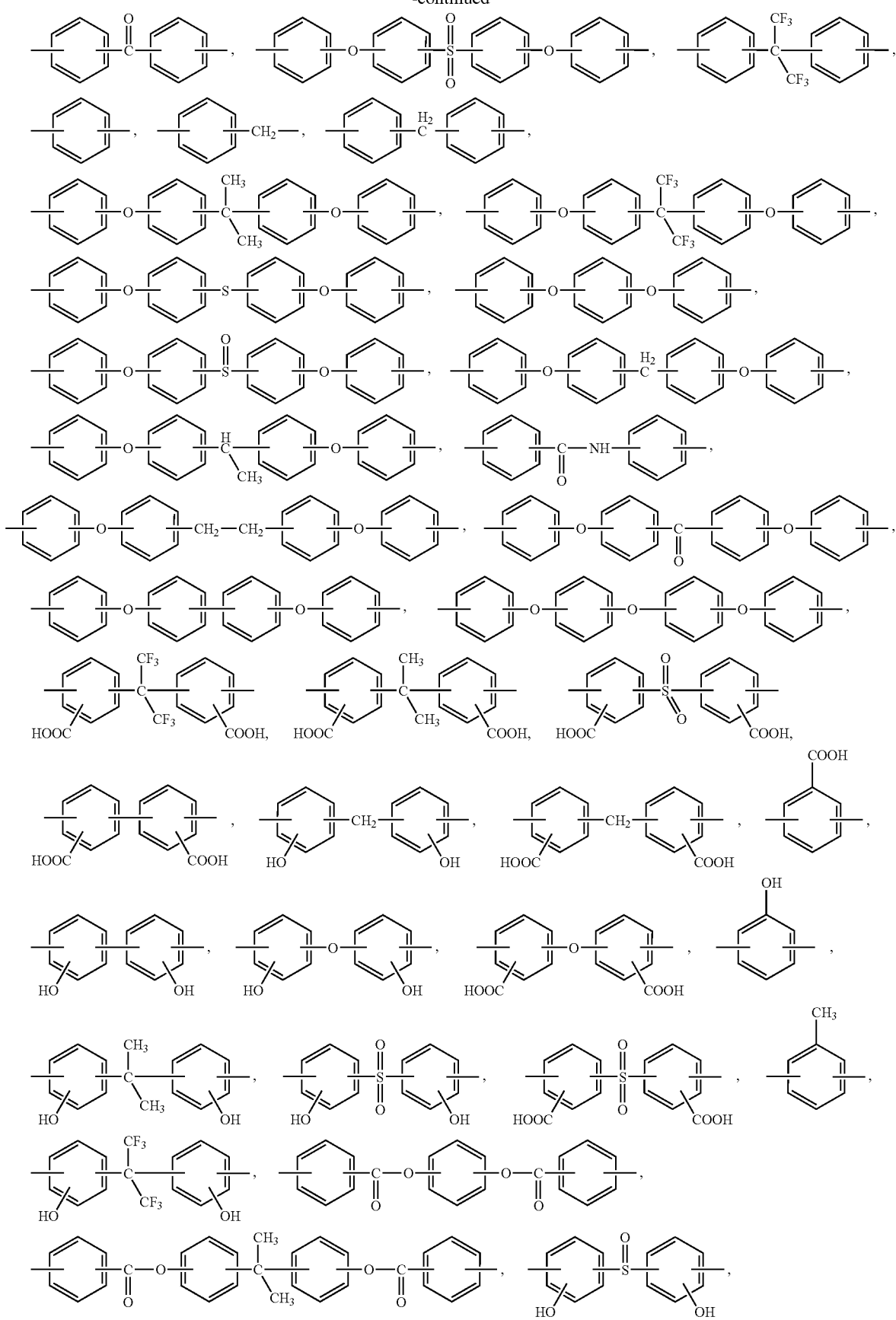

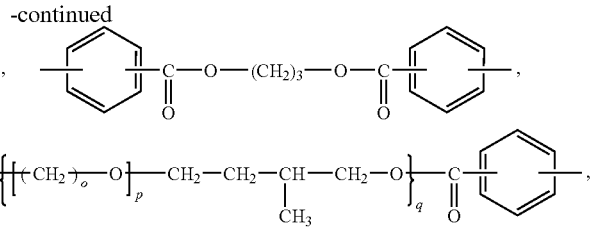

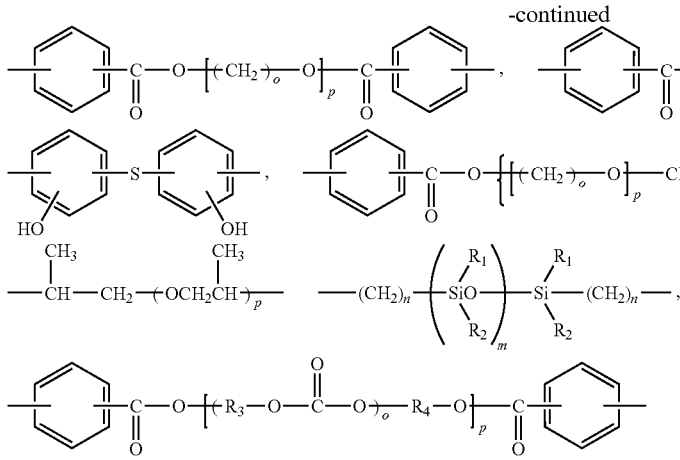

More specifically, examples thereof include m-phenylenediamine, o-phenylenediamine, p-phenylenediamine, m-aminobenzylamine, p-aminobenzylamine, bis(3-aminophenyl) sulfide, (3-aminophenyl)(4-aminophenyl) sulfide, bis(4-aminophenyl) sulfide, bis(3-aminophenyl)sulfoxide, (3-aminophenyl)(4-aminophenyl) sulfoxide, bis(4-aminophenyl) sulfoxide, bis(3-aminophenyl) sulfone, (3-aminophenyl)(4-aminophenyl) sulfone, bis(4-aminophenyl) sulfone, 3,4'-diaminobenzophenone, 4,4'-diaminobenzophenone, 3,3'-diaminobenzophenone, 3,3'-diaminodiphenylmethane, 3,4'-diaminodiphenylmethane, 4,4'-diaminodiphenylmethane, 4,4'-diaminodiphenyl ether, 3,3'-diaminodiphenyl ether, 3,4'-diaminodiphenyl ether, bis[4-(3-aminophenoxy)phenyl]sulfoxide, bis[4-(4-aminophenoxy)phenyl]sulfoxide, (4-aminophenoxyphenyl)(3-aminophenoxyphenyl)phenyl] sulfoxide, bis[4-(3-aminophenoxy)phenyl]sulfone, bis[4-(aminophenoxy)phenyl]sulfone, (4-aminophenoxyphenyl)(3-aminophenoxyphenyl)phenyl]sulfone, bis[4-(3-aminophenoxy)phenyl]sulfide, bis[4-(aminophenoxy)phenyl]sulfide, (4-aminophenoxyphenyl)(3-aminophenoxyphenyl)phenyl]sulfide, 3,3'-diaminobenzanilide, 3,4'-diaminobenzanilide, 4,4'-diaminobenzanilide, bis[4-(3-aminophenoxy)phenyl] methane, bis[4-(4-aminophenoxy)phenyl]methane, [4-(4-aminophenoxyphenyl)][4-(3-aminophenoxyphenyl)] methane, 1,1-bis[4-(3-aminophenoxy)phenyl]ethane, 1,1-bis [4-(4-aminophenoxy)phenyl]ethane, 1,1-[4-(4-aminophenoxyphenyl)][4-(3-aminophenoxyphenyl)]ethane, 1,2-bis[4-(3-aminophenoxy)phenyl]ethane, 1,2-bis[4-(4-aminophenoxy)phenyl]ethane, 1,2-[4-(4-aminophenoxyphenyl)][4-(3-aminophenoxyphenyl)]ethane, 2,2-bis[4-(3-aminophenoxy)phenyl]propane, 2,2-bis[4-(4-aminophenoxy)phenyl]propane, 2,2-[4-(4-aminophenoxyphenyl)][4-(3-aminophenoxyphenyl)]propane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 2,2-[4-(4-aminophenoxyphenyl)][4-(3-aminophenoxyphenyl)]-1,1,1,3,3,3-hexafluoropropane, 1,3-bis(3-aminophenoxy)benzene, 1,4-bis(3-aminophenoxy)benzene, 1,4-bis(4-aminophenoxy)benzene, 1,3-bis(4-aminophenoxy)benzene, 4,4'-bis(4-aminophenoxy) biphenyl, 4,4'-bis(3-aminophenoxy)biphenyl, bis[4-(3-aminophenoxy)phenyl]ketone, bis[4-(4-aminophenoxy) phenyl]ketone, bis[4-(3-aminophenoxy)phenyl]ether, bis[4-(4-aminophenoxy)phenyl]ether, polytetramethylene oxide-di-p-aminobenzoate, poly(tetramethylene/3-methyltetramethylene ether)glycol bis(4-aminobenzoate), trimethylene-bis(4-aminobenzoate), p-phenylene-bis(4-aminobenzoate), m-phenylene-bis(4-aminobenzoate), bisphenol A-bis(4-aminobenzoate), 2,4-diaminobenzoic acid, 2,5-diaminobenzoic acid, 3,5-diaminobenzoic acid, 3,3'-diamino-4,4'-dicarboxybiphenyl, 4,4'-diamino-3,3'-dicarboxybiphenyl, 4,4'-diamino-2,2'-dicarboxybiphenyl, [bis(4-amino-2-carboxy)phenyl]methane, [bis(4-amino-3-carboxy)phenyl] methane, [bis(3-amino-4-carboxy)phenyl]methane, [bis(3-amino-5-carboxy)phenyl]methane, 2,2-bis[3-amino-4-carboxyphenyl]propane, 2,2-bis[4-amino-3-carboxyphenyl] propane, 2,2-bis[3-amino-4-carboxyphenyl] hexafluoropropane, 2,2-bis[4-amino-3-carboxyphenyl] hexafluoropropane, 3,3'-diamino-4,4'-dicarboxydiphenyl ether, 4,4'-diamino-3,3'-dicarboxydiphenyl ether, 4,4'-diamino-2,2'-dicarboxydiphenyl ether, 3,3'-diamino-4,4'-dicarboxydiphenyl sulfone, 4,4'-diamino-3,3'-dicarboxydiphenyl sulfone, 4,4'-diamino-2,2'-dicarboxydiphenyl sulfone, diaminophenols such as 2,3-diaminophenol, 2,4-diaminophenol, 2,5-diaminophenol, and 3,5-diaminophenol; hydroxybiphenyl compounds such as 3,3'-diamino-4,4'-dihydroxybiphenyl, 4,4'-diamino-3,3'-dihydroxybiphenyl, 4,4'-diamino-2,2'-dihydroxybiphenyl, and 4,4'-diamino-2,2',5,5'-tetrahydroxybiphenyl; dihydroxy diphenylmethanes such as 3,3'-diamino-4,4'-dihydroxy diphenylmethane, 4,4'-diamino-3,3'-dihydroxy diphenylmethane, and 4,4'-diamino-2, 2'-dihydroxy diphenylmethane; bis[hydroxyphenyl]propanes such as 2,2-bis[3-amino-4-hydroxyphenyl]propane and 2,2-bis[4-amino-3-hydroxyphenyl]propane; bis[hydroxyphenyl]hexafluoropropanes such as 2,2-bis[3-amino-4-hydroxyphenyl]hexafluoropropane and 2,2-bis[3-amino-4-hydroxyphenyl]hexafluoropropane; hydroxydiphenyl ethers such as 3,3'-diamino-4,4'-dihydroxydiphenyl ether, 4,4'-diamino-3,3'-dihydroxydiphenyl ether, and 4,4'-diamino-2,2'-dihydroxydiphenyl ether; dihydroxydiphenyl sulfones such as 3,3'-diamino-4,4'-dihydroxydiphenyl sulfone, 4,4'-diamino-3,3'-dihydroxydiphenyl sulfone, and 4,4'-diamino-2,2'-dihydroxydiphenyl sulfone; dihydroxydiphenyl sulfides such as 3,3'-diamino-4,4'-dihydroxydiphenyl sulfide, 4,4'-diamino-3,3'-dihydroxydiphenyl sulfide, and 4,4'-diamino-2,2'-dihydroxydiphenyl sulfide; dihydroxydiphenyl sulfoxides such as 3,3'-diamino-4,4'-dihydroxydiphenyl sulfoxide, 4,4'-diamino-3,3'-dihydroxydiphenyl sulfoxide, and 4,4'-diamino-2,2'-dihydroxydiphenyl sulfoxide; bis[(hydroxyphenyl)phenyl]alkane compounds such as 2,2-bis[4-(4-amino-3-hydroxyphenoxy)phenyl]propane; bis(hydroxyphenoxy) biphenyl compounds such as 4,4'-bis(4-amino-3-hydroxyphenoxy)biphenyl; bis[(hydroxyphenoxy)phenyl]

sulfone compounds such as 2,2-bis[4-(4-amino-3-hydroxyphenoxy)phenyl]sulfone; 4,4'-diamino-3,3'-dihydroxydiphenylmethane, 4,4'-diamino-2,2'-dihydroxydiphenylmethane, 2,2-bis[3-amino-4-carboxyphenyl]propane; and bis(hydroxyphenoxy)biphenyl compounds such as 4,4'-bis(4-amino-3-hydroxyphenoxy)biphenyl.

In particular, from the standpoint of improving heat resistance of a polyimide resin coating film prepared using the resulting polyimide precursor composition, the glass transition temperature of the material is preferably 50° C. or higher. As such a raw material, p-phenylenediamine, bis(3-aminophenyl) sulfone, bis(4-aminophenyl) sulfone, 3,3'-diaminodiphenylmethane, 4,4'-diaminodiphenylmethane, 4,4'-diaminodiphenyl ether, 3,3'-diaminodiphenyl ether, bis[4-(3-aminophenoxy)phenyl]sulfone, bis[4-(4-aminophenoxy)phenyl]sulfone, 2,2-bis[4-(3-aminophenoxy)phenyl]propane, 2,2-bis[4-(4-aminophenoxy)phenyl]propane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 1,3-bis(3-aminophenoxy)benzene, 1,4-bis(3-aminophenoxy)benzene, 1,4-bis(4-aminophenoxy)benzene, 1,3-bis(4-aminophenoxy)benzene, bis[4-(3-aminophenoxy)phenyl]ether, bis[4-(4-aminophenoxy)phenyl]ether, polytetramethylene oxide-di-p-aminobenzoate, poly(tetramethylene/3-methyltetramethylene ether)glycol bis(4-aminobenzoate), trimethylene-bis(4-aminobenzoate) p-phenylene-bis(4-aminobenzoate), m-phenylene-bis(4-aminobenzoate), bisphenol A-bis(4-aminobenzoate) 3,5-diaminobenzoic acid, [bis(4-amino-2-carboxy)phenyl]methane, [bis(4-amino-3-carboxy)phenyl]methane, [bis(3-amino-4-carboxy)phenyl]methane, [bis(3-amino-5-carboxy)phenyl]methane, or 2,2-bis[3-amino-4-carboxyphenyl]propane is preferably used.

The use of the above diamines is preferable because high heat resistance can be imparted to a cured coating film obtained when the resulting polyimide precursor composition is cured.

In producing the polyimide precursor composition of the invention of this application, the amount of diamine represented by general formula (2) added is determined as follows: The total of the diamine contained in the final polyimide precursor composition is 0.70 to 1.30 moles, more preferably 0.80 to 1.10 moles, and particularly preferably 0.90 to 1.10 relative to 1 mole of the tetracarboxylic dianhydride used in the method of producing general formula (1). The diamine represented by general formula (2) is added so as to compensate for an insufficient portion of the total amount of diamine represented by general formula (4) or diamines represented by general formula (4) and general formula (5). Controlling the ratio of a diamine represented by general formula (2) to be added to the above ranges is preferable because an imidization reaction is readily carried out in thermal imidization, and a polyimide resin having a high molecular weight can be easily obtained. The temperature at which the diamine represented by general formula (2) is added is not limited as long as imidization is not carried out. The diamine represented by general formula (2) is mixed preferably at 100° C. or lower, and more preferably at 80° C. or lower.

<Method of Preparing Polyimide Precursor Composition Solution>

A method of preparing a polyimide precursor composition solution of the present invention will be described. In the case where a polyimide precursor composition solution is prepared in a solution in which an imidized tetracarboxylic acid is synthesized, preferably, the solution is used without further treatment, and a diamine is added to the solution to prepare a polyimide precursor composition solution. A polyimide precursor composition once separated as a solid is preferably diluted with a solvent and used.

As for the solvent used, the solvents mentioned as solvents used in the polymerization are preferably used alone or as a mixture of two or more type of solvents.

In preparation of the polyimide precursor solution, a solute concentration is preferably 40 to 90 weight percent, and particularly preferably 45 to 85 weight percent as the concentration of the polyimide precursor composition solution.

The solute concentration of the invention of this application is a value calculated from calculation formula 1 below.

$$\text{Solute concentration}(\%) = \text{Solute weight}/(\text{Solute weight} + \text{Solvent weight}) \times 100 \quad \text{Formula 1}$$

The solute weight in the formula is a weight of raw materials other than an organic solvent, the raw materials being dissolved in the organic solvent. For example, a predetermined amount (A grams) of a resin solution is taken out, and heated to a temperature at which the solvent can be volatilized or higher, and the weight (B grams) of the residual solid content is the measured. In this case, the weight (B grams) of the solid content is the solute weight, and a value calculated from calculation formula 2 below is a solvent weight.

$$\text{Solvent weight} = A - B \quad \text{Formula 2}$$

The concentration of a solution in which a polyimide precursor composition in the present invention is dissolved is, as described above, preferably 40 to 90 weight percent, and more preferably 45 to 85 weight percent. When the concentration is within this range, in preparation of a formed body using a polyimide resin composition, the amount of solvent to be removed is decreased, the handleability is improved, the amount of change in the thickness between an applied film and the resulting dried film is decreased in forming a film body or the like, and thus the formability is significantly improved. In addition, the above concentration range is preferable because the viscosity of the polyimide precursor composition solution can be controlled within the optimum range. For example, in the case where a polyimide precursor composition solution is applied and dried to prepare a film formed-body, 6,000 poise or less is generally preferable and 5,000 poise or less is more preferable at 23° C., though it depends on the coating method. If the viscosity exceeds 6,000 poise, coating may become difficult in some cases. In the invention of this application, the viscosity can be freely controlled from high viscosities to low viscosities by adjusting the concentration.

Furthermore, known additives, for example, fillers, e.g., organic silanes, pigments, conductive carbon black, and metal particles; abrasion agents; dielectrics; lubricants, and the like may be optionally added to the polyimide precursor solution of the present invention as long as the advantages of the present invention are not impaired. In addition, other polymers and solvents such as water-insoluble ethers, alcohols, ketones, esters, halogenated hydrocarbons, and hydrocarbons may be added as long as the advantages of the present invention are not impaired.

In order to prepare a polyimide coating film, a polyimide precursor composition solution is applied on a base material by a known method such as a spin coating method, a spray coating method, a screen printing method, an immersion method, a curtain coating method, a dip coating method, or a die coating method, and dried at a temperature of 250° C. or lower to remove a solvent, and imidization is then performed.

According to the polyimide precursor composition of the invention of this application, the temperature required for imidization is low, and curing can be performed at 250° C. or lower. Curing at low temperatures is preferable because, for example, when the composition is applied to a printed wiring board, a copper foil, which is an electrical conductor, is not degraded by oxidation. The curing temperature is particularly preferably 200° C. or lower, and the polyimide precursor composition of the invention of this application can also be cured at such a low temperature of 200° C. or lower.

<Photosensitive Resin Composition>

An example of the use of the polyimide precursor composition of the invention of this application is a photosensitive resin composition. The photosensitive resin composition will be described in detail below. It is to be understood that examples of the use of the polyimide precursor composition of the invention of this application are limited thereto. The constitution of the photosensitive resin composition is as follows. That is, the photosensitive resin composition contains the above-described polyimide precursor composition, and at least a photosensitive resin and a photopolymerization initiator. As for the polyimide precursor composition used in the photosensitive resin composition, any polyimide precursor composition described above can be used without particular limitation. In the polyimide precursor composition, as the imidized tetracarboxylic acid, a tetracarboxylic acid-terminated siloxane imide oligomer obtained using a silicon diamine (siloxane diamine) is preferably used, but the imidized tetracarboxylic acid is not limited thereto.

Each of the constituent materials will now be described.

<Photosensitive Resin>

The photosensitive resin in the invention of this application is a monomer, an oligomer, or a polymer resin that is polymerized with a radical, an acid, a base, a proton, an amine, or the like generated by light or heat. More preferably, the photosensitive resin is a resin having at least one unsaturated double bond. Furthermore, the unsaturated double bond is preferably an acrylic group ($CH_2$=CH— group), a methacryloyl group ($CH_2$=$C(CH_3)$— group), or a vinyl group (—CH=CH— group). Photosensitive resins that can be preferably used in the invention of this application are exemplified below, but any resin may be used as long as the resin has at least one unsaturated double bond.

Preferable examples thereof include, but are not limited to, bisphenol F EO-modified (n=2 to 50) diacrylate, bisphenol A EO-modified (n=2 to 50) diacrylate, bisphenol S EO-modified (n=2 to 50) diacrylate, bisphenol F EO-modified (n=2 to 50) dimethacrylate, bisphenol A EO-modified (n=2 to 50) dimethacrylate, bisphenol S EO-modified (n=2 to 50) dimethacrylate, 1,6-hexanediol diacrylate, neopentyl glycol diacrylate, ethylene glycol diacrylate, pentaerythritol diacrylate, trimethylolpropane triacrylate, pentaerythritol triacrylate, dipentaerythritol hexaacrylate, tetramethylolpropane tetraacrylate, tetraethylene glycol diacrylate, 1,6-hexanediol dimethacrylate, neopentyl glycol dimethacrylate, ethylene glycol dimethacrylate, pentaerythritol dimethacrylate, trimethylolpropane trimethacrylate, pentaerythritol trimethacrylate, dipentaerythritol hexamethacrylate, tetramethylolpropane tetramethacrylate, tetraethylene glycol dimethacrylate, methoxydiethylene glycol methacrylate, methoxypolyethylene glycol methacrylate, β-methacryloyloxyethyl hydrogen phthalate, β-methacryloyloxyethyl hydrogen succinate, 3-chloro-2-hydroxypropyl methacrylate, stearyl methacrylate, phenoxyethyl acrylate, phenoxydiethylene glycol acrylate, phenoxypolyethylene glycol acrylate, β-acryloyloxyethyl hydrogen succinate, lauryl acrylate, ethylene glycol dimethacrylate, diethylene glycol dimethacrylate, triethylene glycol dimethacrylate, polyethylene glycol dimethacrylate, 1,3-butylene glycol dimethacrylate, 1,6-hexanediol dimethacrylate, neopentyl glycol dimethacrylate, polypropylene glycol dimethacrylate, 2-hydroxy-1,3-dimethacryloxypropane, 2,2-bis[4-(methacryloxyethoxy)phenyl]propane, 2,2-bis[4-(methacryloxy•diethoxy)phenyl]propane, 2,2-bis[4-(methacryloxy•polyethoxy)phenyl]propane, polyethylene glycol diacrylate, tripropylene glycol diacrylate, polypropylene glycol diacrylate, 2,2-bis[4-(acryloxy•diethoxy)phenyl]propane, 2,2-bis[4-(acryloxy•polyethoxy)phenyl]propane, 2-hydroxy-1-acryloxy-3-methacryloxypropane, trimethylolpropane trimethacrylate, tetramethylolmethane triacrylate, tetramethylolmethane tetraacrylate, methoxydipropylene glycol methacrylate, methoxytriethylene glycol acrylate, nonylphenoxypolyethylene glycol acrylate, nonylphenoxypolypropylene glycol acrylate, 1-acryloyloxypropyl-2-phthalate, isostearyl acrylate, polyoxyethylenealkyl ether acrylate, nonylphenoxyethylene glycol acrylate, polypropylene glycol dimethacrylate, 1,4-butanediol dimethacrylate, 3-methyl-1,5-pentanediol dimethacrylate, 1,6-hexanediol dimethacrylate, 1,9-nonanediol dimethacrylate, 2,4-diethyl-1,5-pentanediol dimethacrylate, 1,4-cyclohexane dimethanol dimethacrylate, dipropylene glycol diacrylate, tricyclodecane dimethanol diacrylate, 2,2-hydrogenated bis[4-(acryloxy•polyethoxy)phenyl]propane, 2,2-bis[4-(acryloxy•polypropoxy)phenyl]propane, 2,4-diethyl-1,5-pentanediol diacrylate, ethoxylated trimethylolpropane triacrylate, propoxylated trimethylolpropane triacrylate, isocyanuric acid tri(ethane acrylate), pentaerythritol tetraacrylate, ethoxylated pentaerythritol tetraacrylate, propoxylated pentaerythritol tetraacrylate, ditrimethylolpropane tetraacrylate, dipentaerythritol polyacrylate, triallyl isocyanurate, glycidyl methacrylate, glycidyl allyl ether, 1,3,5-triacryloylhexahydro-s-triazine, triallyl 1,3,5-benzenecarboxylate, triallylamine, triallyl citrate, triallyl phosphate, Allobarbital, diallylamine, diallyldimethylsilane, diallyl disulfide, diallyl ether, diallyl cyanurate, diallyl isophthalate, diallyl terephthalate, 1,3-diallyloxy-2-propanol, diallyl sulfide, diallyl maleate, 4,4'-isopropylidenediphenol dimethacrylate, and 4,4'-isopropylidenediphenol diacrylate. In particular, a diacrylate or methacrylate having 2 to 50 repeating units of ethylene oxide (EO) per molecule is preferable, and a diacrylate or methacrylate having 2 to 40 repeating units of EO per molecule is more preferable. By using a diacrylate or methacrylate having 2 to 50 repeating units of EO, for example, the following features can be provided. Solubility in an aqueous developing solution typically represented by an alkaline aqueous solution is improved to reduce the developing time. Furthermore, stress does not readily remain in a cured film obtained by curing the photosensitive resin composition. For example, when the photosensitive resin composition is laminated on, among printed wiring boards, a flexible printed wiring board including a polyimide resin as a base material, curling of the printed wiring board can be suppressed.

In addition to the above exemplification, for example, compounds having a hydroxyl group or a carbonyl group in the molecular structure skeleton, such as 2-hydroxy-3-phenoxypropyl acrylate, phthalic acid monohydroxyethyl acrylate, ω-carboxy-polycaprolactone monoacrylate, acrylic acid dimer, pentaerythritol tri- and tetra acrylates are also preferably used.

In addition to the above resins, any photosensitive resin, for example, epoxy-modified acrylic (methacrylic) resins, urethane-modified acrylic (methacrylic) resins, and polyester-modified acrylic (methacrylic) resins may be used.

The photosensitive resin may be used alone, but two or more types of photosensitive resins are preferably used in combination from the standpoint that heat resistance of a cured film after photo-curing is improved.

<Photopolymerization Initiator>

As the photopolymerization initiator, a photopolymerization initiator having any structure can be used as long as the photopolymerization initiator generates a radical, an acid, a base, a proton, an amine, or the like by irradiation of light. Examples thereof include Michler's ketone, 4,4'-bis(diethylamino) benzophenone, 4,4',4"-tris(dimethylamino)triphenylmethane, 2,2'-bis(2-chlorophenyl)-4,4',5,5'-tetraphenyl-1,2'-diimidazole, acetophenone, benzoin, 2-methylbenzoin, benzoin methyl ether, benzoin ethyl ether, benzoin isopropyl ether, benzoin isobutyl ether, 2-tert-butylanthraquinone, 1,2-benzo-9,10-anthraquinone, methylanthraquinone, thioxanthone, 2,4-diethylthioxanthone, 2-isopropylthioxanthone, 1-hydroxycyclohexyl phenyl ketone, diacetylbenzyl, benzyl dimethyl ketal, benzyl diethyl ketal, 2(2'-furilethylidene)-4,6-bis(trichloromethyl)-S-triazine, 2[2'(5"-methylfuril)ethylidene]-4,6-bis(trichloromethyl-S-triazine, 2(p-methoxyphenyl)-4,6-bis(trichloromethyl)-S-triazine, 2,6-di(p-azidobenzal)-4-methylcyclohexanone, 4,4'-diazidochalcon, di(tetraalkylammonium)-4,4'-diazidostilbene-2,2'-disulfonate, 2,2-dimethoxy-1,2-diphenylethan-1-one, 1-hydroxycyclohexyl-phenyl-ketone, 2-hydroxy-2-methyl-1-phenyl-propan-1-one, 1-[4-(2-hydroxyethoxy)-phenyl]-2-hydroxy-2-methyl-1-propan-1-one, 2-methyl-1-[4-(methylthio)phenyl]-2-morpholinopropan-1-one, 2-benzyl-2-dimethylamino-1-(4-morpholinophenyl)-butane-1, bis(2,4,6-trimethylbenzoyl)-phenylphosphine oxide, bis(2,6-dimethoxybenzoyl)-2,4,4-trimethyl-pentylsulfone oxide, 2,4,6-trimethylbenzoyl-diphenyl-phosphine oxide, 2-hydroxy-2-methyl-1-phenyl-propane-1-ketone, bis(n5-2,4-cyclopentadien-1-yl)-bis(2,6-difluoro-3-(1H-pyrrol-1-yl)-phenyl)titanium, 1,2-octanonedione, 1-[4-(phenylthio)-, 2-(O-benzoyloxime)], iodonium, (4-methylphenyl)[4-(2-methylpropyl)phenyl]-hexafluorophosphate(1-), ethyl-4-dimethylaminobenzoate, 2-ethylhexyl-4-dimethylaminobenzoate, and ethanone, 1-[9-ethyl-6-(2-methylbenzoyl)-9H-carbazol-3-yl]-1-(O-acetyloxime). The above photopolymerization initiator is preferably appropriately selected, and one or more photopolymerization initiators are preferably used as a mixture.

As for the component proportion of the polyimide precursor composition, the photosensitive resin, and the photopolymerization initiator in the photosensitive resin composition of the invention of this application, these components are preferably mixed so that the photosensitive resin is 10 to 200 parts by weight and the photopolymerization initiator is 0.1 to 50 parts by weight relative to 100 parts by weight of the solid content of the polyimide precursor composition.

The above mixing ratio is preferable because properties (electrical insulation reliability and the like) of a final cured product or insulating film can be improved.

If the amount of photosensitive resin is smaller than the above range, heat resistance of a cured coating film obtained after photo-curing of the photosensitive resin is decreased, and the contrast after exposure and development tends to be decreased. Therefore, by controlling the amount of photosensitive resin within the above range, the resolution in exposure and development can be controlled within the optimum range.

If the amount of photopolymerization initiator is smaller than the above range, a curing reaction of the photosensitive resin during light irradiation does not readily occur, and curing may become insufficient. In contrast, if the amount of photopolymerization initiator is larger than the above range, it is difficult to adjust the amount of light irradiation, which may cause an overexposure state. Therefore, in order to efficiently carry out a photo-curing reaction, the amount of photopolymerization initiator is preferably adjusted to the above range.

<Thermosetting Resin>

The photosensitive resin composition of the invention of this application preferably contains a thermosetting resin so that the resin composition has good heat resistance (such as soldering heat resistance), chemical resistances (such as alkaline solution resistance, acid resistance, and solvent resistance), moisture resistance environment stability, and heat resistance environment stability after curing.

Examples of the thermosetting resin that can be used in the photosensitive resin composition of the present invention include thermosetting resins such as epoxy resins, isocyanate resins, block isocyanate resins, bismaleimide resins, bisallylnadiimide resins, acrylic resins, methacrylic resins, hydrosilyl cured resins, allyl cured resins, and unsaturated polyester resins; and side-chain reactive group-type thermosetting polymers having an allyl group, a vinyl group, an alkoxysilyl group, a hydrosilyl group, or the like in the side chain or at a terminal of the polymer chain. The above thermosetting components may be used alone or in appropriate combinations of two or more types of the components.

Among these, epoxy resins are preferably used. By incorporating an epoxy resin, heat resistance (such as soldering heat resistance), chemical resistances (such as alkaline solution resistance, acid resistance, and solvent resistance), moisture resistance environment stability, and heat resistance environment stability can be imparted to a cured resin obtained by curing a thermosetting resin composition, and adhesiveness to a conductor, such as a metal foil, or a circuit board can be imparted.

As the epoxy resins, epoxy resins having any structure may be used as long as the epoxy resins have at least two epoxy groups in its molecule. Examples of the epoxy resins include bisphenol-A-type epoxy resins, bisphenol-AD-type epoxy resins, bisphenol-S-type epoxy resins, bisphenol-F-type epoxy resins, bisphenol A novolak-type epoxy resins, hydrogenated bisphenol-A-type epoxy resins, ethylene oxide adduct bisphenol-A-type epoxy resins, propylene oxide adduct bisphenol-A-epoxy resins, novolak-type epoxy resins, glycidyl ester-type epoxy resins, biphenyl-type epoxy resins, phenol novolak-type epoxy resins, alkylphenol novolak-type epoxy resins, polyglycol-type epoxy resins, cycloaliphatic epoxy resins, cyclopentadiene-type epoxy resins, dicyclopentadiene-type epoxy resins, cresol novolak-type epoxy resins, glycidyl amine-type epoxy resins, naphthalene-type epoxy resins, urethane-modified epoxy resins, rubber-modified epoxy resins, and epoxy-modified polysiloxanes. These epoxy resins may be used alone or in combinations of two or more types of resins in any ratio.

Examples of the epoxy resins include naphthalene-type tetrafunctional epoxy resin Epiclon HP-4700 (trade name), a cyclopentadiene-type epoxy resin Epiclon HP-7200 (trade name), a phenol novolak-type epoxy resin Epiclon N-740 (trade name), a highly heat-resistant epoxy resin Epiclon EXA-7240, cresol novolak-type polyfunctional epoxy resins Epiclon N-660, N-665, N-670, N-680, and N-655-EXP, a phenol novolak-type epoxy resin Epiclon N-740 (trade name), a tetraphenylethane-type epoxy resin Epiclon ETePE (trade name), and a triphenylmethane-type epoxy resin Epiclon ETrPM (trade name), all of which are manufactured by Dainippon Ink & Chemicals Inc.; bisphenol-A-type epoxy resin Epicoat 828 etc. (trade name) manufactured by Japan Epoxy Resins Co., Ltd.; bisphenol-F-type epoxy resin YDF-170 etc. (trade name) manufactured by Tohto Kasei Co., Ltd.; phenol novolak epoxy resins such as Epicoat 152 and 154

(trade name) manufactured by Japan Epoxy Resins Co., Ltd., EPPN-201 (trade name) manufactured by Nippon Kayaku Co., Ltd., and DEN-438 etc. (trade name) manufactured by The Dow Chemical Company; o-cresol novolak-type epoxy resins EOCN-125S, 103S, and 104S etc. (trade name) manufactured by Nippon Kayaku Co., Ltd.; polyfunctional epoxy resins such as Epon1031S (trade name) manufactured by Japan Epoxy Resins Co., Ltd., Araldite 0163 (trade name) manufactured by Ciba Specialty Chemicals, Denacol EX-611, EX-614, EX-614B, EX-622, EX-512, EX-521, EX-421, EX-411, and EX-321 (trade name) manufactured by Nagase Chemicals, Ltd.; amine-type epoxy resins such as Epicoat 604 (trade name) manufactured by Japan Epoxy Resins Co., Ltd., YH434 (trade name) manufactured by Tohto Kasei Co., Ltd., TETRAD-X and TERRAD-C (trade name) manufactured by Mitsubishi Gas Chemical Company, Inc., GAN (trade name) manufactured by Nippon Kayaku Co., Ltd., and ELM-120 etc. (trade name) manufactured by Sumitomo Chemical Co., Ltd.; heterocycle-containing epoxy resins such as Araldite PT810 etc. (trade name) manufactured by Ciba Specialty Chemicals; and alicyclic epoxy resins such as ERL 4234, 4299, 4221, and 4206 etc. manufactured by UCC Co., Ltd. These may be used alone or in combinations of two or more types of resins.

The amount of thermosetting resin used in the present invention is preferably 0.5 to 100 parts by weight relative to 100 parts by weight of the total solid content of a polyimide precursor composition, a photosensitive resin, and a photopolymerization initiator. The amount of thermosetting resin is further preferably 1.0 to 50 parts by weight, and particularly preferably 1.0 to 10 parts by weight. Mixing the thermosetting resin in the above range is preferable because heat resistance, chemical resistance, and electrical insulation reliability of a cured film of the resulting photosensitive resin composition can be improved. In addition, controlling the mixing ratio in the above range is preferable because flexibility can be imparted to the resulting cured product after the photosensitive resin composition is cured.

Furthermore, in the epoxy resin used in the photosensitive resin composition of the present invention, in addition to the above-mentioned epoxy resins, an epoxy compound having only one epoxy group per molecule may also be used in combination. Examples thereof include n-butyl glycidyl ether, phenyl glycidyl ether, dibromophenyl glycidyl ether, and dibromocresyl glycidyl ether. Examples thereof further include alicyclic epoxy compounds such as 3,4-epoxycyclohexylmethyl(3,4-epoxycyclohexane) carboxylate.

In the photosensitive resin composition of the present invention, as a curing agent of the above-mentioned thermosetting resin, a compound having a phenolic hydroxyl group, a compound having an amine group, a compound having a carboxylic acid, a compound having a mercapto group, or a compound having an isocyanate group may be used. For example, phenolic resins such as a phenol novolak-type phenolic resin, a cresol novolak-type phenolic resin, and a naphthalene-type phenolic resin; amino resins; urea resins; melamine resins; dicyandiamide; dihydrazine compounds; imidazole compounds; salts of a Lewis acid or a Bronstead acid; polymercaptan compounds; isocyanate and block isocyanate compounds, and the like can be used in combination.

In addition, examples of a curing accelerator of the thermosetting resin include, but are not particularly limited to, phosphine compounds such as triphenylphosphine; amine compounds such as tertiary amines, trimethanolamine, triethanolamine, and tetraethanolamine; borate compounds such as 1,8-diaza-bicyclo[5,4,0]-7-undecenium tetraphenylborate; imidazoles such as imidazole, 2-ethylimidazole, 2-ethyl-4-methylimidazole, 2-phenylimidazole, 2-undecylimidazole, 1-benzyl-2-methylimidazole, 2-heptadecylimidazole, 2-isopropylimidazole, 2,4-dimethylimidazole, and 2-phenyl-4-methylimidazole; imidazolines such as 2-methylimidazoline, 2-ethylimidazoline, 2-isopropylimidazoline, 2-phenylimidazoline, 2-undecylimidazoline, 2,4-dimethylimidazoline, and 2-phenyl-4-methylimidazoline; azine imidazoles such as 2,4-diamino-6-[2'-methylimidazolyl-(1')]-ethyl-s-triazine, 2,4-diamono-6-[2'-undecylimidazolyl-(1')]-ethyl-s-triazine, and 2,4-diamino-6-[2'-ethyl-4'-methylimidazolyl-(1')]-ethyl-s-triazine. In the case where an amino group is contained in a urethane resin, from the standpoint that circuit-embedding properties can be improved, imidazoles such as 2-ethyl-4-methylimidazole, 2-phenyl-4-methylimidazole, or 2,4-diamino-6-[2'-undecylimidazolyl-(1')]-ethyl-s-triazine is preferably used.

<Other Components>

Various types of additives such as a flame retardant, an antifoaming agent, a coupling agent, a filler, an adhesive auxiliary agent, a leveling agent, and a polymerization inhibitor may be further added to the photosensitive resin composition of the present invention, as required. As the filler, a fine inorganic filler such as silica, mica, talc, barium sulfate, Wollastonite, or calcium carbonate; a fine organic polymer filler may be incorporated. Preferably, the content thereof is appropriately selected.

<Photosensitive Resin Composition Solution>

The photosensitive resin composition of the invention of this application is preferably used as a photosensitive resin composition solution in which the photosensitive resin composition is dissolved in an organic solvent from the standpoint of handleability. The photosensitive resin composition of the invention of this application has high solubility in various organic solvents. Examples of the solvent that can be used include sulfoxide solvents such as dimethyl sulfoxide and diethyl sulfoxide; formamide solvents such as N,N-dimethylformamide and N,N-diethylformamide; acetamide solvents such as N,N-dimethylacetamide and N,N-diethylacetamide; pyrrolidone solvents such as N-methyl-2-pyrrolidone and N-vinyl-2-pyrrolidone; phenolic solvents such as phenol, o-, m- or p-cresol, xylenol, halogenated phenols, and catechol; hexamethylphosphoramide; γ-butyrolactone; symmetric glycol diethers such as methyl monoglyme (1,2-dimethoxyethane), methyl diglyme (bis(2-methoxyethyl)ether), methyl triglyme (1,2-bis(2-methoxyethoxy)ethane), methyl tetraglyme (bis[2-(2-methoxyethoxyethyl)]ether), ethyl monoglyme (1,2-diethoxyethane), ethyl diglyme (bis(2-ethoxyethyl)ether), and butyl diglyme (bis(2-butoxyethyl)ether); γ-butyrolactone; N-methyl-2-pyrrolidone; acetates such as methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (synonyms: carbitol acetate and 2-(2-butoxyethoxy)ethyl)acetate), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate; and ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripropylene glycol n-propyl ether, propylene glycol phenyl ether, dipropylene glycol dimethyl ether, 1,3-dioxolane, ethylene glycol monobutyl ether, diethylene glycol monoethyl ether, diethylene glycol monobutyl ether, and ethylene glycol monoethyl ether. Note that the photosensitive resin composition solution may be prepared by optionally using hexane, acetone, toluene, xylene, or the like, which has a low boiling point.

Among these, symmetric glycol diethers are preferable because the solubility of the photosensitive resin composition is high.

In the photosensitive resin composition solution of the invention of this application, an organic solvent is preferably contained in an amount of 10 parts by weight or more and 100 parts by weight or less relative to 100 parts by weight of the total solid content of the photosensitive resin composition.

The photosensitive resin composition solution within this range is preferable because the rate of reduction in the film thickness after drying decreases.

<Method of Producing Photosensitive Resin Composition>

The photosensitive resin composition of the present invention is obtained by uniformly mixing various raw materials to be contained in the photosensitive resin composition. As for a method of uniformly mixing the raw materials, mixing may be performed with an ordinary kneading machine such as a triple-roll mill or a beads mill device. In the case where the viscosity of a solution is low, mixing may be performed with an ordinary stirring device.

<Method of Using Photosensitive Resin Composition>

The photosensitive resin composition of the present invention can be patterned as follows directly or after the photosensitive resin composition solution is prepared. First, the above-described photosensitive resin composition is applied to a substrate and dried to remove an organic solvent. The application to the substrate can be performed by screen printing, curtain roll coating, reverse roll coating, spray coating, spin coating using a spinner, or the like. The applied film (thickness: preferably 5 to 100 μm, particularly preferably 10 to 100 μm) is dried at 120° C. or lower, and preferably 40° C. to 100° C. After drying, a negative photomask is placed on the dry applied film, and the film is irradiated with active rays such as ultraviolet rays, visible rays, or electron beams. Subsequently, unexposed portions are washed out with a developer by a method such as a shower method, a puddle method, an immersion method, an ultrasonic method, or the like to form a relief pattern. The time required for exposing the pattern varies depending on the atomizing pressure and flow rate of a development apparatus, and the temperature of an etchant. Therefore, it is desirable that the optimum conditions for the apparatus be appropriately determined.

As the developer, an alkaline aqueous solution is preferably used, and the developer may contain a water-soluble organic solvent such as methanol, ethanol, n-propanol, isopropanol, or N-methyl-2-pyrrolidone. Examples of alkaline compounds that provides the alkaline aqueous solution includes alkali metals; alkaline earth metals; hydroxides, carbonates, and hydrogencarbonates of an ammonium ion; and amine compounds. Specific examples thereof include sodium hydroxide, potassium hydroxide, ammonium hydroxide, sodium carbonate, potassium carbonate, ammonium carbonate, sodium hydrogencarbonate, potassium hydrogencarbonate, ammonium hydrogencarbonate, tetramethylammonium hydroxide, tetraethylammonium hydroxide, tetrapropylammonium hydroxide, tetraisopropylammonium hydroxide, N-methyldiethanolamine, N-ethyldiethanolamine, N,N-dimethylethanolamine, triethanolamine, triisopropanolamine, and triisopropylamine. Compounds other than these can be used as long as an aqueous solution thereof is basic. The concentration of the alkaline compounds that can be suitably used in the step of developing the photosensitive resin composition of the invention of this application is preferably 0.01 to 20 weight percent, and particularly preferably 0.02 to 10 weight percent. Furthermore, the temperature of the developer depends on the composition of the photosensitive resin composition and the composition of the alkaline developing solution. The developer is used generally at 0° C. or higher and 80° C. or lower, and more generally at 10° C. or higher and 60° C. or lower.

The relief pattern formed in the step of development is rinsed to remove unnecessary residues. Examples of a rinse liquid include water and acidic aqueous solutions.

Next, imidization of an imidized tetracarboxylic acid and a diamine is performed by a heat treatment. Thus, a cured film having good heat resistance can be produced. The thickness of the cured film is determined in consideration of the thickness of wiring etc., but is preferably about 2 to 50 μm. As for the final curing temperature in this step, in order to prevent oxidation of the wiring etc. and a decrease in the adhesiveness between the wiring and a base material, it is desirable that the imidization can be performed by heating at a low temperature.

The imidization temperature in this step is preferably 100° C. or higher and 250° C. or lower, further preferably 120° C. or higher and 200° C. or lower, and particularly preferably 130° C. or higher and 190° C. or lower. A high final heating temperature is not preferable because oxidation degradation of wiring proceeds.

A pattern composed of a cured film formed from the photosensitive resin composition of the present invention has good heat resistance and electrical and mechanical properties, and in particular, good flexibility. For example, an insulating film of the present invention preferably has a film thickness of about 2 to 50 μm, and has a resolution of at least up to 10 μm, and in particular, a resolution of about 10 to 1,000 μm after photo-curing. Therefore, the insulating film of the present invention is particularly suitable as an insulating material for a high-density flexible substrate. Furthermore, the insulating film of the present invention is used as various types of photo-curable wiring-coating protective agents, photosensitive heat-resistant adhesives, electrical wire/cable insulating coatings, or the like.

Because of this good low-temperature processability, the polyimide precursor composition of the invention of this application can be preferably used as, for example, a wiring-coating protective agent for protecting surfaces of base materials of printed wiring boards (including flexible printed wiring boards) made of a polyimide resin, an epoxy resin, an aramid resin, or the like; a wiring-coating protective agent for an electrical wire/cable or the like; or a heat-resistant interlayer adhesive used when flexible printed wiring boards are laminated. In particular, the polyimide precursor composition has good electrical insulation reliability, and thus can be used as a wiring-coating protective agent for a printed wiring board.

As for a method of coating a surface of such a printed wiring board, coating can be performed by using the same method as the above-described method of producing a coating film.

EXAMPLES

The present invention will now be specifically described with reference to Examples, but the present invention is not limited to these Examples.

Example 1

2,2-Bis[4-(3,4-dicarboxyphenoxy)phenyl]propane dianhydride (200 g, 0.384 mol) was dispersed in 1,2-bis(2-methoxyethoxy)ethane (183 g), and the resulting dispersion liquid was maintained at 80° C. A silicon diamine (siloxane diamine) (manufactured by Shin-Etsu Chemical Co., Ltd.: trade name KF8010, molecular weight 830, a silicon diamine represented by general formula (7) below:

[Chem. 26]

General formula (7)

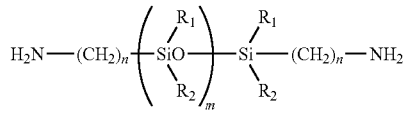

wherein each of $R_1$ and $R_2$ is a methyl group, n=3, and m=6 to 11) (128 g, 0.154 mol) was added thereto, and the resulting mixture was uniformly stirred for 30 minutes. Next, the reaction mixture was heated to 140° C. and stirred for one hour, and the reaction was terminated. The reaction mixture was then heated to 180° C. and refluxed under heating for three hours. After the completion of the reaction, the reaction mixture was cooled to room temperature, and 27.7 g (1.54 mol) of water was added thereto. The reaction mixture was uniformly stirred for 30 minutes, then heated to 80° C., and refluxed under heating for three hours. Thus, a solution in which an imidized tetracarboxylic acid (tetracarboxylic acid-terminated siloxane imide oligomer) was dissolved was prepared. Subsequently, the solution was cooled to room temperature, and 99.7 g (0.230 mol) of bis[4-(3-aminophenoxy)phenyl] sulfone was added to the solution, and the resulting mixture was uniformly stirred at room temperature for one hour to prepare a polyimide precursor composition solution. The solute concentration of this solution was 70 weight percent, and the viscosity of the solution was 240 poise at 23° C.

In order to examine storage stability of the polyimide precursor composition solution, the solution was hermetically sealed in a 10 mL-screw tube, and left to stand for one month in a chamber in which the temperature was maintained at 20° C., and the viscosity after one month was measured. The viscosity at that time was 240 poise at 23° C., and thus a change in the viscosity was not observed. It became clear that the polyimide precursor composition solution could be stored for a long time at room temperature.

(Preparation of Coating Film on Polyimide Film)

The above polyimide precursor composition solution was cast and applied to a polyimide film (manufactured by Kaneka Corporation: trade name 75NPI) of 75 μm so that the final dry thickness was 25 μm using a Baker-type applicator, and was dried at 120° C. for one hour. The resulting film was then heated at 160° C. for 30 minutes in a nitrogen atmosphere to perform imidization.

(Adhesiveness of Coating Film)

The adhesive strength of the polyimide film was evaluated by a cross-cut tape method in accordance with JIS K5400.
In the case where detachment was not observed in the cross-cut tape method, the film was evaluated as ○.
In the case where half or more of grids remained, the film was evaluated as Δ.
In the case where the number of remaining grids was less than half, the film was evaluated as x.

(Stability of Film in Environmental Resistance Test)

If imidization of a polyimide film is not sufficient, stability in an environmental test apparatus decreases. Accordingly, stability in an environmental test apparatus was measured.

A constant-temperature, high-humidity chamber manufactured by ESPEC Corporation, Model PR-1K was used as the environmental test apparatus. The stability was evaluated in the form of a coating film on a polyimide film after a test was performed at 85° C./85% RH for 1,000 hours.
In the case where the polyimide resin was not changed, the film was evaluated as ○.
In the case where the polyimide resin was partly dissolved, the film was evaluated as Δ.
In the case where the polyimide resin was completely dissolved, the film was evaluated as x.

(Chemical Resistance)

Chemical resistance of a polyimide film surface was evaluated. As for the evaluation method, the evaluation was performed by immersing a film under the evaluation conditions of evaluation items 1 to 3 below, and then observing the state of a surface of the film.

Evaluation item 1: A film was immersed in isopropanol at 25° C. for 10 minutes, and then dried in air.
Evaluation item 2: A film was immersed in a 2N hydrochloric acid solution at 25° C. for 10 minutes, washed with purified water, and then dried in air.
Evaluation item 3: A film was immersed in a 2N sodium hydroxide solution at 25° C., washed with purified water, and then dried in air.
In the case where the polyimide resin was not changed, the film was evaluated as ○.
In the case where the polyimide resin was partly dissolved, the film was evaluated as Δ.
In the case where the polyimide resin was completely dissolved, the film was evaluated as x.

(Evaluation of Flexibility)

A polyimide resin solution was applied to a surface of a polyimide film (manufactured by Kaneka Corporation, API-CAL 25NPI) having a thickness of 25 μm so that the final film thickness was 25 μm. The resulting film was dried at 120° C. for 90 minutes, and then at 160° C. for 30 minutes. Thus, a polyimide film laminate was prepared. The polyimide film laminate was cut to a strip having dimensions of 30 mm×10 mm. The strip was bended at an angle of 180° at a position of 15 mm ten times. The presence of cracks was examined by visually observing the coating film.
○: Cracks were not observed in the cured film.
Δ: Cracks were somewhat observed in the cured film.
x: Cracks were observed in the cured film.
The results of the above evaluations are shown in Table 1.

Example 2

2,2-Bis[4-(3,4-dicarboxyphenoxy)phenyl]propane dianhydride (200 g, 0.384 mol) was dispersed in 1,2-bis(2-methoxyethoxy)ethane (169 g), and the resulting dispersion liquid was maintained at 80° C. A silicon diamine (siloxane diamine) (manufactured by Shin-Etsu Chemical Co., Ltd.: trade name KF8010, molecular weight 830, a silicon diamine represented by general formula (7) below:

[Chem. 27]

General formula (7)

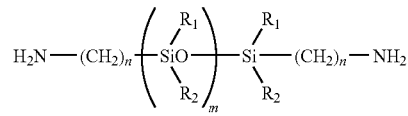

wherein each of $R_1$ and $R_2$ is a methyl group, n=3, and m=6 to 11) (128 g, 0.154 mol) was added thereto, and the resulting mixture was uniformly stirred for 30 minutes. Next, the reaction mixture was heated to 140° C. and stirred for one hour, and the reaction was terminated. The reaction mixture was then heated to 180° C. and refluxed under heating for three hours. After the completion of the reaction, the reaction mixture was cooled to room temperature, and 27.7 g (1.54 mol) of water was added thereto. The reaction mixture was uniformly stirred for 30 minutes, then heated to 80° C., and refluxed under heating for three hours. Thus, a solution in which an imidized tetracarboxylic acid (tetracarboxylic acid-terminated siloxane imide oligomer) was dissolved was prepared. Subsequently, the solution was cooled to room temperature, and 67.4 g (0.230 mol) of 1,3-bis(3-aminophenoxy)benzene was added to the solution, and the resulting mixture was uniformly stirred at room temperature for one hour to prepare a polyimide precursor composition solution. The solute concentration of this solution was 70 weight percent, and the viscosity of the solution was 320 poise at 23° C.

In order to examine storage stability of the polyimide precursor composition solution, the solution was hermetically sealed in a 10 mL-screw tube, and left to stand for one month in a chamber in which the temperature was maintained at 20° C., and the viscosity after one month was measured. The viscosity at that time was 320 poise at 23° C., and thus a change in the viscosity was not observed. It became clear that the polyimide precursor composition solution could be stored for a long time at room temperature.

Furthermore, properties of a cured coating film obtained from the polyimide precursor composition were evaluated by the same methods as in Example 1. The evaluation results are shown in Table 1.

Example 3

2,2-Bis[4-(3,4-dicarboxyphenoxy)phenyl]propane dianhydride (200 g, 0.384 mol) was dispersed in 1,2-bis(2-methoxyethoxy)ethane (193 g), and the resulting dispersion liquid was maintained at 80° C. A silicon diamine (siloxane diamine) (manufactured by Shin-Etsu Chemical Co., Ltd.: trade name X-22-9409S, molecular weight 1,492, a silicon diamine represented by general formula (7) below:

[Chem. 28]

General formula (7)

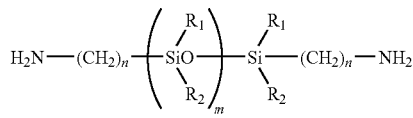

wherein each of $R_1$ and $R_2$ is a methyl group or a phenyl group, n=3, and m=9 to 12) (172 g, 0.115 mol) was added thereto, and the resulting mixture was uniformly stirred for 30 minutes. Next, the reaction mixture was heated to 140° C. and stirred for one hour, and the reaction was terminated. The reaction mixture was then heated to 180° C. and refluxed under heating for three hours. After the completion of the reaction, the reaction mixture was cooled to room temperature, and 27.7 g (1.54 mol) of water was added thereto. The reaction mixture was uniformly stirred for 30 minutes, then heated to 80° C., and refluxed under heating for three hours. Thus, a solution in which an imidized tetracarboxylic acid (tetracarboxylic acid-terminated siloxane imide oligomer) was dissolved was prepared. Subsequently, the solution was cooled to room temperature, and 78.3 g (0.268 mol) of 1,3-bis(3-aminophenoxy)benzene was added to the solution, and the resulting mixture was uniformly stirred at room temperature for one hour to prepare a polyimide precursor composition solution. The solute concentration of this solution was 70 weight percent, and the viscosity of the solution was 120 poise at 23° C.

In order to examine storage stability of the polyimide precursor composition solution, the solution was hermetically sealed in a 10 mL-screw tube, and left to stand for one month in a chamber in which the temperature was maintained at 20° C., and the viscosity after one month was measured. The viscosity at that time was 120 poise at 23° C., and thus a change in the viscosity was not observed. It became clear that the polyimide precursor composition solution could be stored for a long time at room temperature.

Furthermore, properties of a cured coating film obtained from the polyimide precursor composition were evaluated by the same methods as in Example 1. The evaluation results are shown in Table 1.

Example 4

2,2-Bis[4-(3,4-dicarboxyphenoxy)phenyl]propane dianhydride (200 g, 0.384 mol) was dispersed in 1,2-bis(2-methoxyethoxy)ethane (207 g), and the resulting dispersion liquid was maintained at 80° C. A silicon diamine (siloxane diamine) (manufactured by Shin-Etsu Chemical Co., Ltd.: trade name X-22-9409S, molecular weight 1,492, a silicon diamine represented by general formula (7) below:

[Chem. 29]

General formula (7)

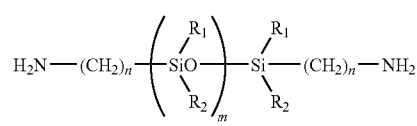

wherein each of $R_1$ and $R_2$ is a methyl group or a phenyl group, n=3, and m=9 to 12) (172 g, 0.115 mol) was added thereto, and the resulting mixture was uniformly stirred for 30 minutes. Next, the reaction mixture was heated to 140° C. and stirred for one hour, and the reaction was terminated. The reaction mixture was then heated to 180° C. and refluxed under heating for three hours. After the completion of the reaction, the reaction mixture was cooled to room temperature, and 27.7 g (1.54 mol) of water was added thereto. The reaction mixture was uniformly stirred for 30 minutes, then heated to 80° C., and refluxed under heating for three hours. Thus, a solution in which an imidized tetracarboxylic acid (tetracarboxylic acid-terminated siloxane imide oligomer) was dissolved was prepared. Subsequently, the solution was cooled to room temperature, and 110 g (0.268 mol) of 2,2-bis[4-(4-aminophenoxy)phenyl]propane was added to the solution, and the resulting mixture was uniformly stirred at room temperature for one hour to prepare a polyimide precursor composition solution. The solute concentration of this solution was 70 weight percent, and the viscosity of the solution was 130 poise at 23° C.

In order to examine storage stability of the polyimide precursor composition solution, the solution was hermetically sealed in a 10 mL-screw tube, and left to stand for one month in a chamber in which the temperature was maintained at 20° C., and the viscosity after one month was measured. The viscosity at that time was 130 poise at 23° C., and thus a change in the viscosity was not observed. It became clear that the polyimide precursor composition solution could be stored for a long time at room temperature.

Furthermore, properties of a cured coating film obtained from the polyimide precursor composition were evaluated by the same methods as in Example 1. The evaluation results are shown in Table 1.

Example 5

4,4'-Diphenylsulfone tetracarboxylic dianhydride (40.0 g, 0.112 mol) was dispersed in 1,2-bis(2-methoxyethoxy)ethane (68.4 g), and the resulting dispersion liquid was maintained at 20° C. A silicon diamine (siloxane diamine) (manufactured by Shin-Etsu Chemical Co., Ltd.: trade name KF8010, molecular weight 830, a silicon diamine represented by general formula (7) below:

[Chem. 30]

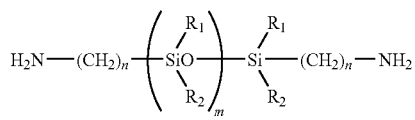

General formula (7)

wherein each of $R_1$ and $R_2$ is a methyl group, n=3, and m=6 to 11) (46.3 g, 0.056 mol) was added thereto, and the resulting mixture was uniformly stirred for 90 minutes. Next, the reaction mixture was heated to 180° C. and refluxed under heating for three hours. After the completion of the reaction, the reaction mixture was cooled to room temperature, and 4.01 g (0.224 mol) of water was added thereto. The reaction mixture was uniformly stirred for 30 minutes, then heated to 80° C., and refluxed under heating for three hours. Thus, a solution in which an imidized tetracarboxylic acid (tetracarboxylic acid-terminated siloxane imide oligomer) was dissolved was prepared. Subsequently, the solution was cooled to room temperature, and 16.3 g (0.056 mol) of 1,3-bis(3-aminophenoxy)benzene was added to the solution, and the resulting mixture was uniformly stirred at room temperature for one hour to prepare a polyimide precursor composition solution. The solute concentration of this solution was 60 weight percent, and the viscosity of the solution was 10 poise at 23° C.

In order to examine storage stability of the polyimide precursor composition solution, the solution was hermetically sealed in a 10 mL-screw tube, and left to stand for one month in a chamber in which the temperature was maintained at 20° C., and the viscosity after one month was measured. The viscosity at that time was 10 poise at 23° C., and thus a change in the viscosity was not observed. It became clear that the polyimide precursor composition solution could be stored for a long time at room temperature.

Furthermore, properties of a cured coating film obtained from the polyimide precursor composition were evaluated by the same methods as in Example 1. The evaluation results are shown in Table 1.

Example 6

2,2-Bis[4-(3,4-dicarboxyphenoxy)phenyl]propane dianhydride (300 g, 0.576 mol) was dispersed in 1,2-bis(2-methoxyethoxy)ethane (510 g), and the resulting dispersion liquid was maintained at 80° C. Polycarbonate diol bis(4-aminobenzoate) (a diamine represented by general formula (8) below:

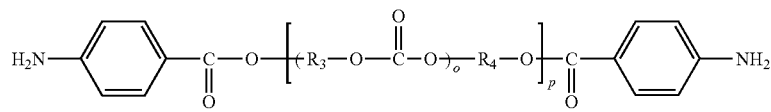

General formula (8)

wherein $R_3$ is a hexamethylene group and $R_4$ is a pentamethylene group, o and p=1 to 20, and the molecular weight is 1,180) (272 g, 0.231 mol) was added thereto, and the resulting mixture was uniformly stirred for 30 minutes. Next, the reaction mixture was heated to 140° C. and stirred for one hour, and the reaction was terminated. The reaction mixture was then heated to 180° C. and refluxed under heating for three hours. After the completion of the reaction, the reaction mixture was cooled to room temperature, and 27.7 g (1.54 mol) of water was added thereto. The reaction mixture was uniformly stirred for 30 minutes, then heated to 80° C., and refluxed under heating for three hours. Thus, a solution in which an imidized tetracarboxylic acid was dissolved was prepared. Subsequently, the solution was cooled to room temperature, and 150 g (0.345 mol) of bis[4-(3-aminophenoxy)phenyl]sulfone was added to the solution, and the resulting mixture was uniformly stirred at room temperature for one hour to prepare a polyimide precursor composition solution. The solute concentration of this solution was 60 weight percent, and the viscosity of the solution was 200 poise at 23° C.

In order to examine storage stability of the polyimide precursor composition solution, the solution was hermetically sealed in a 10 mL-screw tube, and left to stand for one month in a chamber in which the temperature was maintained at 20° C., and the viscosity after one month was measured. The viscosity at that time was 200 poise at 23° C., and thus a change in the viscosity was not observed. It became clear that the polyimide precursor composition solution could be stored for a long time at room temperature.

Furthermore, properties of a cured coating film obtained from the polyimide precursor composition were evaluated by the same methods as in Example 1. The evaluation results are shown in Table 1.

Example 7

2,2-Bis[4-(3,4-dicarboxyphenoxy)phenyl]propane dianhydride (300 g, 0.576 mol) was dispersed in 1,2-bis(2-methoxyethoxy)ethane (414 g), and the resulting dispersion liquid was maintained at 80° C. A silicon diamine (siloxane diamine) (manufactured by Shin-Etsu Chemical Co., Ltd.: trade name KF8010, molecular weight 830, a silicon diamine represented by general formula (7) below:

[Chem. 33]

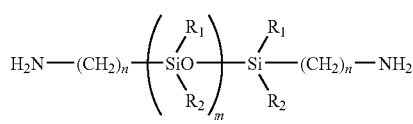

General formula (7)

wherein each of $R_1$ and $R_2$ is a methyl group, n=3, and m=6 to 11) (239 g, 0.288 mol) was added thereto, and 14.3 g (0.058 mol) of 3,3'-diaminodiphenyl sulfone was further added thereto. The resulting mixture was uniformly stirred for 30 minutes. Next, the reaction mixture was heated to 140° C. and stirred for one hour, and the reaction was terminated. The reaction mixture was then heated to 180° C. and refluxed under heating for three hours. After the completion of the reaction, the reaction mixture was cooled to room temperature, and 41.5 g (2.30 mol) of water was added thereto. The reaction mixture was uniformly stirred for 30 minutes, then heated to 80° C., and refluxed under heating for three hours. Thus, a solution in which an imidized tetracarboxylic acid (tetracarboxylic acid-terminated siloxane imide oligomer) was dissolved was prepared. Subsequently, the solution was cooled to room temperature, and 67.4 g (0.230 mol) of 1,3-bis(3-aminophenoxy)benzene was added to the solution, and the resulting mixture was uniformly stirred at room temperature for one hour to prepare a polyimide precursor composition solution. The solute concentration of this solution was 60 weight percent, and the viscosity of the solution was 100 poise at 23° C.

In order to examine storage stability of the polyimide precursor composition solution, the solution was hermetically sealed in a 10 mL-screw tube, and left to stand for one month in a chamber in which the temperature was maintained at 20° C., and the viscosity after one month was measured. The viscosity at that time was 100 poise at 23° C., and thus a change in the viscosity was not observed. It became clear that the polyimide precursor composition solution could be stored for a long time at room temperature.

An experiment was conducted by the same method as in Example 1 except that in preparing a coating film on a polyimide film surface, the coating film was dried at a temperature of 120° C. for 90 minutes and then at 190° C. for 30 minutes in a nitrogen atmosphere. Evaluation was also performed as in Example 1. The evaluation results are shown in Table 1.

Comparative Example 1

Hexamethylene diamine (2.73 g, 23.5 mmol) was dissolved in dimethylacetamide (24.0 g). 3,3',4,4'-Benzophenonetetracarboxylic dianhydride (3.78 g, 11.75 mmol) was gradually added to the resulting solution over a period of 30 minutes to prepare an oligomer having a polyamide bond. The resulting mixture was uniformly stirred for one hour, and 3.02 g (9.40 mol) of 3,3',4,4'-benzophenonetetracarboxylic acid was then added thereto, and stirring was continued for one hour. As a result, a viscous solution was obtained (solute concentration: 28 weight percent). As a result of measurement of the viscosity of this solution, the viscosity was 3,100 poise.

In order to examine storage stability of the solution, the solution was hermetically sealed in a 10 mL-screw tube, and left to stand for one month in a chamber in which the temperature was maintained at 20° C., and the viscosity after one month was measured. The viscosity at that time was 300 poise at 23° C. The change in the viscosity was significant, and thus a problem occurred in terms of the storage stability.

Evaluation was performed by the same methods as in Example 1. The evaluation results are shown in Table 2.

Comparative Example 2

2,2-Bis[4-(3,4-dicarboxyphenoxy)phenyl]propane dianhydride (200 g, 0.384 mol) was dispersed in 1,2-bis(2-methoxyethoxy)ethane (183 g), and the resulting dispersion liquid was maintained at 80° C. A silicon diamine (siloxane diamine) (manufactured by Shin-Etsu Chemical Co., Ltd.: trade name KF8010, molecular weight 830, a silicon diamine represented by general formula (7) below:

[Chem. 34]

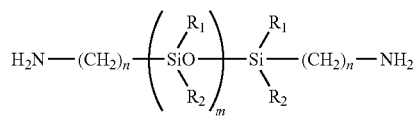

General formula (7)

wherein each of $R_1$ and $R_2$ is a methyl group, n=3, and m=6 to 11) (128 g, 0.154 mol) was added thereto, and the resulting mixture was uniformly stirred for 30 minutes. Next, the reaction mixture was heated to 140° C. and stirred for one hour, and the reaction was terminated. The reaction mixture was then heated to 180° C. and refluxed under heating for three hours. After the completion of the reaction, the reaction mixture was cooled to room temperature, and 49.3 g (1.54 mol) of methanol was added thereto. The reaction mixture was uniformly stirred for 30 minutes, then heated to 80° C., and refluxed under heating for three hours. Thus, a solution of an imide in which terminal carboxylic acids were half-esterified was prepared. Subsequently, the solution was cooled to room temperature, and 99.7 g (0.230 mol) of bis[4-(3-aminophenoxy)phenyl]sulfone was added to the solution, and the resulting mixture was uniformly stirred at room temperature for one hour to prepare a polyimide precursor composition solution. The solute concentration of this solution was 70 weight percent, and the viscosity of the solution was 120 poise at 23° C.

In order to examine storage stability of the solution, the solution was hermetically sealed in a 10 mL-screw tube, and left to stand for one month in a chamber in which the temperature was maintained at 20° C., and the viscosity after one month was measured. The viscosity at that time was 120 poise at 23° C., and thus a change in the viscosity was not observed. It became clear that the polyimide precursor composition solution could be stored for a long time at room temperature.

Results obtained by the same evaluation methods as in Example 1 are shown in Table 2.

It became clear that stability in the environmental resistance test was poor, and solvent resistance and alkali resistance were also poor.

Comparative Example 3

4,4'-Diaminodiphenyl ether (8.22 g, 41.1 mmol) was dissolved in N,N-dimethylacetamide (55.0 g), and the resulting solution was stirred at room temperature. Pyromellitic dianhydride (11.9 g, 54.8 mmol) was added to the solution, and the solution was stirred at room temperature for two hours. Next, 1.32 g (41.1 mmol) of methanol and 0.066 g of dimethylaminoethanol were added to the solution, and the resulting solution was stirred under heating for two hours in a hot water bath at 70° C. The solution was cooled to room temperature, and 2.74 g (13.7 mmol) of 4,4'-diaminodiphenyl ether was then added thereto and stirring was further continued for one hour. As a result, a uniform solution was obtained. The viscosity of the solution was 18 poise at 23° C.

In order to examine storage stability of the solution, the solution was hermetically sealed in a 10 mL-screw tube, and left to stand for one month in a chamber in which the temperature was maintained at 20° C., and the viscosity after one month was measured. The viscosity at that time was 50 poise at 23° C. It became clear that there is a problem regarding the storage stability at room temperature.

Results obtained by the same evaluation methods as in Example 1 are shown in Table 2.

Comparative Example 4

2,2-Bis[4-(3,4-dicarboxyphenoxy)phenyl]propane dianhydride (200 g, 0.384 mol) was dispersed in 1,2-bis(2-methoxyethoxy)ethane (183 g), and the resulting dispersion liquid was maintained at 80° C. A silicon diamine (siloxane diamine) (manufactured by Shin-Etsu Chemical Co., Ltd.: trade name KF8010, molecular weight 830, a silicon diamine represented by general formula (7) below:

[Chem. 35]

General formula (7)

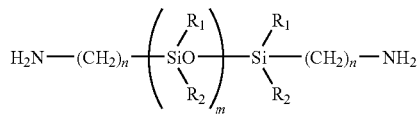

wherein each of $R_1$ and $R_2$ is a methyl group, n=3, and m=6 to 11) (128 g, 0.154 mol) was added thereto, and the resulting mixture was uniformly stirred for 30 minutes. Next, the reaction mixture was heated to 140° C. and stirred for one hour, and the reaction was terminated. The reaction mixture was then heated to 180° C. and refluxed under heating for three hours. The reaction mixture was cooled to room temperature, and 27.7 g (1.54 mol) of water was added thereto. The reaction mixture was uniformly stirred for 30 minutes, then heated to 80° C., and refluxed under heating for three hours. Thus, a solution in which an imidized tetracarboxylic acid was dissolved was prepared.

The diamine-free solution in which the imidized tetracarboxylic acid was dissolved was evaluated by the same methods as in Example 1. The results are shown in Table 2.

Comparative Example 5

Pyromellitic dianhydride (7.00 g, 32.1 mmol) was dispersed in 1,2-bis(2-methoxyethoxy)ethane (31.3 g), and water (2.31 g) was added thereto. The resulting mixture was stirred at 80° C. for 10 hours to prepare a pyromellitic acid solution. 4,4'-Diaminodiphenyl ether (6.43 g, 32.1 mmol) was added to this solution to prepare a solution.

Formation of a film was attempted using this solution by the same evaluation method as in Example 1. However, the solution was solidified on a surface of a polyimide film, and was not formed into a film.

Comparative Example 6

2,2-Bis[4-(3,4-dicarboxyphenoxy)phenyl]propane dianhydride (200 g, 0.384 mol) was dispersed in 1,2-bis(2-methoxyethoxy)ethane (183 g), and the resulting dispersion liquid was maintained at 80° C. A silicon diamine (siloxane diamine) (manufactured by Shin-Etsu Chemical Co., Ltd.: trade name KF8010, molecular weight 830, a silicon diamine represented by general formula (7) below:

[Chem. 36]

General formula (7)

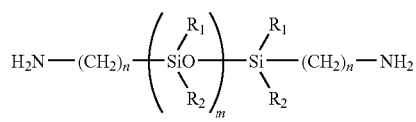

wherein each of $R_1$ and $R_2$ is a methyl group, n=3, and m=6 to 11) (128 g, 0.154 mol) was added thereto, and the resulting mixture was uniformly stirred for 30 minutes. Next, the reaction mixture was heated to 140° C. and stirred for one hour, and the reaction was terminated. The reaction mixture was then heated to 180° C. and refluxed under heating for three hours. The reaction mixture was cooled to room temperature, and 99.7 g (0.230 mol) of bis[4-(3-aminophenoxy)phenyl]sulfone was added to the solution without adding water. The resulting mixture was uniformly stirred at room temperature for one hour to prepare a polyimide precursor composition solution. The solute concentration of this solution was 70 weight percent. The solution was a highly viscous elastomer having a viscosity of 10,000 poise or more at 23° C. Even when this solution was diluted so as to have a solute concentration of 20 weight percent, the solution had a very high viscosity of 6,000 poise at 23° C., and physical property values of the solution could not be evaluated.

Synthesis Example 1

2,2-Bis[4-(3,4-dicarboxyphenoxy)phenyl]propane dianhydride (hereinafter abbreviated as "BPADA") (200 g, 0.384 mol) was dispersed in 1,2-bis(2-methoxyethoxy)ethane (140 g), and the resulting dispersion liquid was maintained at 80° C. A silicon diamine (siloxane diamine) (which is manufactured by Shin-Etsu Chemical Co., Ltd.: trade name KF8010, molecular weight 830, and in which each of $R_1$ and $R_2$ in general formula (1) is a methyl group, n=3, and m=6 to 11) (128 g, 0.154 mol) was added thereto, and the resulting mixture was uniformly stirred for 30 minutes. Next, the reaction mixture was heated to 140° C. and uniformly stirred for one hour. The reaction mixture was then heated to 180° C. and refluxed under heating for three hours to conduct an imidization reaction. Next, the reaction mixture was cooled to 80° C., 27.7 g (1.54 mol) of water was added thereto, and the resulting reaction mixture was refluxed under heating for five hours. Thus, a solution in which an imidized tetracarboxylic acid (tetracarboxylic acid-terminated siloxane imide oligomer) was dissolved was prepared. The solid content concentration of this solution was 66 weight percent, and the viscosity of the solution was 140 poise at 23° C. This tetracarboxylic acid-terminated siloxane imide oligomer solution was a stable solution, and the viscosity of this solution was hardly changed even after the solution was left to stand at room temperature for one month. This synthesized compound is abbreviated as "Compound A".

Synthesis Example 2

BPADA (200 g, 0.384 mol) was dispersed in 1,2-bis(2-methoxyethoxy)ethane (159 g), and the resulting dispersion liquid was maintained at 80° C. A silicon diamine (siloxane diamine) (which is manufactured by Shin-Etsu Chemical Co., Ltd.: trade name X-22-9409S, molecular weight 1,492, and in which each of $R_1$ and $R_2$ in the formula is a methyl group or a phenyl group, n=3, and m=9 to 12) (172 g, 0.115 mol) was added thereto, and the resulting mixture was uniformly stirred for 30 minutes. Next, the reaction mixture was heated to 140° C. and uniformly stirred for one hour. The reaction mixture was then heated to 180° C. and refluxed under heating for three hours to conduct an imidization reaction. Next, the reaction mixture was cooled to 80° C., 27.7 g (1.54 mol) of water was added thereto, and the resulting reaction mixture was refluxed under heating for five hours. Thus, a solution in which an imidized tetracarboxylic acid (tetracarboxylic acid-terminated siloxane imide oligomer) was dissolved was prepared. The solid content concentration of this solution was 67 weight percent, and the viscosity of the solution was 120 poise at 23° C. This tetracarboxylic acid-terminated siloxane imide oligomer solution was a stable solution, and the viscosity of this solution was hardly changed even after the solution was left to stand at room temperature for one month. This synthesized compound is abbreviated as "Compound B".

Synthesis Example 3

BPADA (200 g, 0.384 mol) was dispersed in 1,2-bis(2-methoxyethoxy)ethane (154 g), and the resulting dispersion liquid was maintained at 80° C. A silicon diamine (siloxane diamine) (which is manufactured by Shin-Etsu Chemical Co., Ltd.: trade name KF8010, molecular weight 830, and in which each of $R_1$ and $R_2$ in general formula (1) is a methyl group, n=3, and m=6 to 11) (159 g, 0.192 mol) was added thereto, and the resulting mixture was uniformly stirred for 30 minutes. Next, the reaction mixture was heated to 140° C. and uniformly stirred for one hour. The reaction mixture was then heated to 180° C. and refluxed under heating for three hours to conduct an imidization reaction. The reaction mixture was cooled to 80° C., 27.7 g (1.54 mol) of water was added thereto, and the resulting reaction mixture was refluxed under heating for five hours. Thus, a solution in which an imidized tetracarboxylic acid (tetracarboxylic acid-terminated siloxane imide oligomer) was dissolved was prepared. The solid content concentration of this solution was 66 weight percent, and the viscosity of the solution was 100 poise at 23° C. This tetracarboxylic acid-terminated siloxane imide oligomer solution was a stable solution, and the viscosity of this solution was hardly changed even after the solution was left to stand at room temperature for one month. This synthesized compound is abbreviated as "Compound C".

Synthesis Example 4

BPADA (200 g, 0.384 mol) was dispersed in 1,2-bis(2-methoxyethoxy)ethane (184 g), and the resulting dispersion liquid was maintained at 80° C. A silicon diamine (siloxane diamine) (which is manufactured by Shin-Etsu Chemical Co., Ltd.: trade name X-22-9409S, molecular weight 1,492, and in which each of $R_1$ and $R_2$ in the formula is a methyl group or a phenyl group, n=3, and m=9 to 12) (229 g, 0.154 mol) was added thereto, and the resulting mixture was uniformly stirred for 30 minutes. Next, the reaction mixture was heated to 140° C. and uniformly stirred for one hour. The reaction mixture was then heated to 180° C. and refluxed under heating for three hours to conduct an imidization reaction. The reaction mixture was cooled to 80° C., and 27.7 g (1.54 mol) of water was added thereto. The reaction mixture was uniformly stirred for 30 minutes, then heated to 80° C., and refluxed under heating for five hours. Thus, a solution in which an imidized tetracarboxylic acid (tetracarboxylic acid-terminated siloxane imide oligomer) was dissolved was prepared. The solid content concentration of this solution was 67 weight percent, and the viscosity of the solution was 90 poise at 23° C. This tetracarboxylic acid-terminated siloxane imide oligomer solution was a stable solution, and the viscosity of this solution was hardly changed even after the solution was left to stand at room temperature for one month. This synthesized compound is abbreviated as "Compound D".

Synthesis Example 5

The water added after the reaction in Synthesis Example 1 was changed to methanol to perform half-esterification. This synthesized compound is abbreviated as "Compound E".

Synthesis Example 6

The reaction described in Synthesis Example 1 was conducted without adding water after the reaction to prepare an imidized acid anhydride each terminal of which has an anhydride group. This synthesized compound is abbreviated as "Compound F".

Examples 8 to 11

A diamine (referred to as "component (B)" in Table 3), photosensitive resins (referred to as "component (C)" in Table 3), a photopolymerization initiator (referred to as "component (D)" in Table 3), and an organic solvent were added to each of the tetracarboxylic acid-terminated siloxane imide oligomers (referred to as "component (A)" in Table 3) prepared in Synthesis Examples 1 to 4 to prepare photosensitive resin composition solutions. The amounts of constituent raw materials mixed in terms of resin solid content, and the types of raw materials are shown in Table 3. Note that the amount of 1,2-bis(2-methoxyethoxy)ethane which is a solvent shown in the table represents the total amount of solvent including a solvent contained in the photosensitive resin composition solution and the like.

Each of the photosensitive resin compositions was first mixed using a stirring device equipped with an ordinary mixing impeller, and the resulting solution was then passed through a triple-roll mill two times to prepare a uniform solution. The resulting mixed solution was completely deaerated with a deaerator, and an evaluation described below was performed.

The evaluation results are shown in Table 4.

(Preparation of Coating Film on Polyimide Film)

Each of the above photosensitive resin composition solutions was cast and applied to a polyimide film (manufactured by Kaneka Corporation: trade name 75NPI) of 75 μm in an area of 100 mm×100 mm so that the final dry thickness was 25 μm using a Baker-type applicator, and was dried at 80° C. for 20 minutes. Thus, ten dry films were prepared for each composition. For nine of the films, a negative photomask in which an area of 50 mm×50 mm was completely transparent was placed on each of the films. For one of the films, a negative photomask of line width/space width=100 μm/100 μm (photomask on which ten lines of 30 mm in length×100 μm in width remained) was placed in the film. These films were sensitized by being exposed to 300 mJ/cm$^2$ of ultraviolet rays in a nitrogen atmosphere. These sensitized films were developed by spraying a 1.0 weight percent aqueous sodium carbonate solution heated at 30° C. at a spraying pressure of 1.0 kgf/mm² for 30 seconds. After the development, the films were sufficiently washed with purified water, and then dried by heating in an oven at 170° C. for 60 minutes. Thus, cured films of each of the photosensitive resin compositions were prepared.

(Evaluation of Photosensitivity)

Photosensitivity of each of the photosensitive resin compositions was evaluated by observing a surface of the cured film obtained in the above section (of preparation of coating film on polyimide film).

On the polyimide film surface,

○: a sharp sensitized pattern of line width/space width=100 μm/100 μm was formed, deformation of lines caused by detachment of line portions did not occur, and dissolution residues were not observed on space portions.

Δ: a sharp sensitized pattern of line width/space width=100 μm/100 μm was formed, deformation of lines caused by detachment of line portions occurred, but dissolution residues were not observed on space portions.

X: a sharp sensitized pattern of line width/space width=100 μm/100 μm was not formed, line portions were detached, and dissolution residues were observed on space portions.

(Adhesiveness of Coating Film)

The adhesive strength of each of the cured films of the photosensitive resin compositions obtained in the above section (of preparation of coating film on polyimide film) was evaluated by a cross-cut tape method in accordance with JIS K5400.

In the case where detachment was not observed in the cross-cut tape method, the film was evaluated as ○.

In the case where 95% or more of grids remained, the film was evaluated as Δ.

In the case where the amount of remaining grids was less than 80%, the film was evaluated as X.

(Solvent Resistance)

Solvent resistance of each of the cured films of the photosensitive resin compositions obtained in the above section (of preparation of coating film on polyimide film) was evaluated. The evaluation was performed by immersing the films in isopropanol at 25° C. for 15 minutes, then dried in air, and observing the states of film surfaces.

○: No problem was observed on the coating film.

x: A problem occurred on the coating film.

(Acid Resistance)

Acid resistance of each of the cured films of the photosensitive resin compositions obtained in the above section (of preparation of coating film on polyimide film) was evaluated. The evaluation was performed by immersing the films in a 2N hydrochloric acid solution at 25° C. for 15 minutes, then dried in air, and observing the states of film surfaces.

○: A problem (whitening or detachment) was not observed on the coating film.

x: A problem (whitening or detachment) occurred on the coating film.

(Alkali Resistance)

Alkali resistance of each of the cured films of the photosensitive resin compositions obtained in the above section (of preparation of coating film on polyimide film) was evaluated. The evaluation was performed by immersing the films in a 2N sodium hydroxide solution at 25° C. for 15 minutes, then dried in air, and observing the states of film surfaces.

○: A problem (whitening or detachment) was not observed on the coating film.

x: A problem (whitening or detachment) occurred on the coating film.

(Flexibility)

By the same method as the method described in the above section (of preparation of coating film on polyimide film), a cured film-laminated film of each of the photosensitive resin compositions was formed on a surface of a polyimide film (manufactured by Kaneka Corporation, APICAL 25NPI) having a thickness of 25 μm. The cured film-laminated film was cut to a strip having dimensions of 30 mm×10 mm. The strip was bended at an angle of 180° at a position of 15 mm ten times. The presence of cracks was examined by visually observing the coating film.

○: Cracks were not observed in the cured film.

Δ: Cracks were somewhat observed in the cured film.

X: Cracks were observed in the cured film.

(Moisture-resistance Insulating Property)

A comb-shaped pattern of line width/space width=100 μm/100 μm was formed on a flexible copper-clad laminate (the thickness of a copper foil was 12 μm, the polyimide film was APICAL 25NPI manufactured by Kaneka Corporation, and the copper foil was bonded using a polyimide adhesive). The flexible copper-clad laminate was immersed in a 10 volume percent aqueous sulfuric acid solution for one minutes, and then washed with purified water to perform a surface treatment of the copper foil. Subsequently, a cured film of the photosensitive resin composition was formed on the comb-shaped pattern by the same method as the method of preparing a cured film on a polyimide film, and a test piece was prepared. A direct current of 100 V was applied to both terminal portions of the test piece in an environmental test apparatus at 85° C. and 85% RH, and a change in the insulation resistance, occurrence of migration, and the like were observed.

○: 500 hours after the start of the test, the resistance was $10^6$ or more, and occurrence of migration, formation of dendrites, or the like was not observed.

x: 500 hours after the start of the test, occurrence of migration, formation of dendrites, or the like was observed.

Example 12

Evaluation was performed by the same methods as in Example 8 except that 5 parts by weight of an epoxy resin (cresol novolak-type polyfunctional epoxy resin Epiclon N-665) was added relative to 100 parts by weight of the solid content of the photosensitive resin composition of Example 9. Furthermore, as a test of soldering heat resistance, evaluation was performed by an evaluation method described below. The evaluation results are shown in Table 4.

(Soldering Heat Resistance)

A photosensitive resin composition solution was cast and applied to a polyimide film (manufactured by Kaneka Corporation: trade name 75NPI) of 75 μm in an area of 100 mm×100 mm so that the final dry thickness was 25 μm using a Baker-type applicator, and was dried at 80° C. for 20 minutes. A negative photomask in which an area of 50 mm×50 mm was completely transparent was placed on the film, and the film was sensitized by being exposed to 300 mJ/cm² of ultraviolet rays in a nitrogen atmosphere. The sensitized film was developed by spraying a 1.0 weight percent aqueous sodium carbonate solution heated at 30° C. at a spraying pressure of 1.0 kgf/mm² for 30 seconds. After the development, the film was sufficiently washed with purified water, and then dried by heating in an oven at 170° C. for 60 minutes. Thus, a cured film of the photosensitive resin composition was prepared.

The resulting coating film was floated on a solder bath that was completely melted at 260° C. such that a surface having the cured film of the photosensitive resin composition thereon was in contact with the solder bath. Ten seconds later, the film was pulled up. This operation was performed three times, and the adhesive strength of the cured film was evaluated by a cross-cut tape method in accordance with JIS K5400.
In the case where detachment was not observed in the cross-cut tape method, the cured film was evaluated as ○.
In the case where 95% or more of grids remained, the cured film was evaluated as Δ.
In the case where the amount of remaining grids was less than 80%, the cured film was evaluated as x.

Example 13

Evaluation was performed by the same methods as in Example 8 except that 5 parts by weight of an epoxy resin (cresol novolak-type polyfunctional epoxy resin Epiclon N-665) was added relative to 100 parts by weight of the solid content of the photosensitive resin composition of Example 9. Furthermore, as a test of soldering heat resistance, evaluation was performed by the same evaluation method as in Example 12. The evaluation results are shown in Table 4.

Comparative Example 7

A photosensitive resin composition solution was prepared by the same method as in Example 8 except that the half-esterified compound prepared in Synthesis Example 5 was used, and evaluation was performed by the same method as in Example 8. The evaluation results are shown in Table 5. Imidization was not sufficiently carried out, and the moisture-resistance insulating property was very poor.

Comparative Example 8

In the compound synthesized in Synthesis Example 6, an anhydride group-terminated imide siloxane oligomer reacted with a diamino compound, and the resulting solution had a high viscosity. In the evaluation, the viscosity of the solution was decreased by adding 1,2-bis(2-methoxyethoxy)ethane to a viscosity range in which the solution could be used. The evaluation results are shown in Table 5. The photosensitivity was poor.

TABLE 1

|  |  | Example 1 | Example 2 | Example 3 | Example 4 | Example 5 | Example 6 | Example 7 |
|---|---|---|---|---|---|---|---|---|
| Adhesiveness of coating film | | ○ | ○ | ○ | ○ | ○ | ○ | ○ |
| Stability of film in environmental resistance test | | ○ | ○ | ○ | ○ | ○ | ○ | ○ |
| Chemical resistance | Item 1 | ○ | ○ | ○ | ○ | ○ | ○ | ○ |
| | Item 2 | ○ | ○ | ○ | ○ | ○ | ○ | ○ |
| | Item 3 | ○ | ○ | ○ | ○ | ○ | ○ | ○ |
| Evaluation of flexibility | | ○ | ○ | ○ | ○ | ○ | ○ | ○ |

TABLE 2

|  |  | Comparative Example 1 | Comparative Example 2 | Comparative Example 3 | Comparative Example 4 |
|---|---|---|---|---|---|
| Adhesiveness of coating film | | X | ○ | X | X |
| Environmental resistance test stability of film | | X | X | X | X |
| Chemical resistance | Evaluation item 1 | X | Δ | X | X |
| | Evaluation item 2 | X | X | X | X |
| | Evaluation item 3 | X | Δ | X | X |
| Evaluation of flexibility | | X | ○ | X | X |

TABLE 3

Units: parts by weight

|  |  | Example 8 | Example 9 | Example 10 | Example 11 | Comparative Example 7 | Comparative Example 8 |
|---|---|---|---|---|---|---|---|
| Component (A) | Compound A | 51.6 | | | | | |
| | Compound B | | 55.6 | | | | |
| | Compound C | | | 54.6 | | | |
| | Compound D | | | | 58.2 | | |
| | Compound E | | | | | 51.6 | |
| | Compound F | | | | | | 51.6 |
| Component (B) | Bis[4-(3-aminophenoxy)phenyl]sulfone | 15.7 | | 12.6 | | 15.7 | 15.7 |
| | 1,3-Bis(3-aminophenoxy)benzene | | 11.7 | | 9.1 | | |
| Component (C) | M-5710 *1 | 11.6 | 11.6 | 11.6 | 11.6 | 11.6 | 11.6 |
| | BPE-1300N *2 | 5.8 | 5.8 | 5.8 | 5.8 | 5.8 | 5.8 |

TABLE 3-continued

| | | Example 8 | Example 9 | Example 10 | Example 11 | Comparative Example 7 | Comparative Example 8 |
|---|---|---|---|---|---|---|---|
| | | | | | | Units: parts by weight | |
| Component (D) | IRGACURE 819 *3 | 1.8 | 1.8 | 1.8 | 1.8 | 1.8 | 1.8 |
| Other component | Talc | 13.5 | 13.5 | 13.5 | 13.5 | 13.5 | 13.5 |
| | 1,2-Bis(2-methoxyethoxy)ethane | 62 | 62 | 62 | 62 | 62 | 300 |
| | Solid content concentration of photosensitive resin composition | 62 | 62 | 62 | 62 | 62 | 25 |

*1 Manufactured by TOAGOSEI Co., Ltd. Product name M-5710 (2-Hydroxy-3-phenoxypropyl acrylate)
*2 Manufactured by Shin-Nakamura Chemical Co., Ltd. Bisphenol A EO-modified diacrylate having a molecular weight of 1,684
*3 Manufactured by Ciba Specialty Chemicals, Photopolymerization initiator

TABLE 4

| Evaluation Items | Example 8 | Example 9 | Example 10 | Example 11 | Example 12 | Example 13 |
|---|---|---|---|---|---|---|
| Photosensitivity | ○ | ○ | ○ | ○ | ○ | ○ |
| Adhesiveness | ○ | ○ | ○ | ○ | ○ | ○ |
| Solvent resistance | ○ | ○ | ○ | ○ | ○ | ○ |
| Acid resistance | ○ | ○ | ○ | ○ | ○ | ○ |
| Alkali resistance | ○ | ○ | ○ | ○ | ○ | ○ |
| Flexibility | ○ | ○ | ○ | ○ | ○ | ○ |
| Moisture-resistance insulating property | ○ | ○ | ○ | ○ | ○ | ○ |
| Soldering heat resistance | — | — | — | — | ○ | ○ |

TABLE 5

| Evaluation Items | Comparative Example 7 | Comparative Example 8 |
|---|---|---|
| Photosensitivity | Δ | X |
| Adhesiveness | ○ | ○ |
| Solvent resistance | ○ | ○ |
| Acid resistance | ○ | ○ |
| Alkali resistance | ○ | ○ |
| Flexibility | ○ | ○ |
| Moisture-resistance insulating property | X | ○ |

The invention claimed is:

1. A polyimide precursor composition comprising:
at least an imidized tetracarboxylic acid represented by formula (1) below:

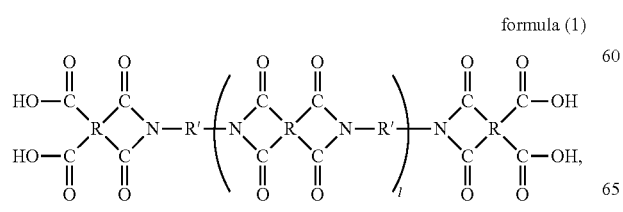

formula (1)

wherein Rs each independently represent a tetravalent organic group, R's each independently represent a divalent organic group, and l represents an integer of 0 to 20; and
a diamine represented by formula (2) below:

$$H_2N—R''—NH_2 \quad \text{formula (2)},$$

wherein R" represents a divalent organic group.

2. The polyimide precursor composition according to claim 1, wherein each of the Rs in the formula (1) above is a tetravalent organic group selected from formula group (1) below:

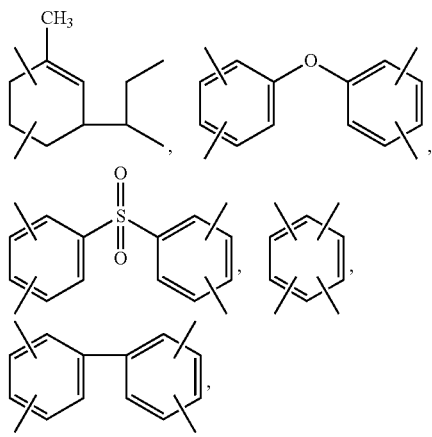

formula group (1)

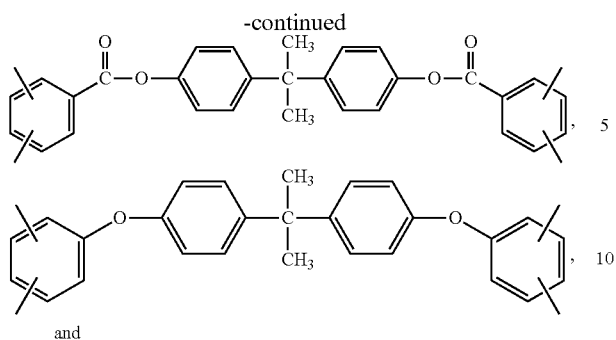

and

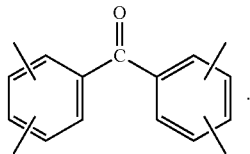

3. The polyimide precursor composition according to claim 1, wherein each of the R's in the formula (1) above at least includes a divalent organic group represented by formula group (2) below:

formula group (2)

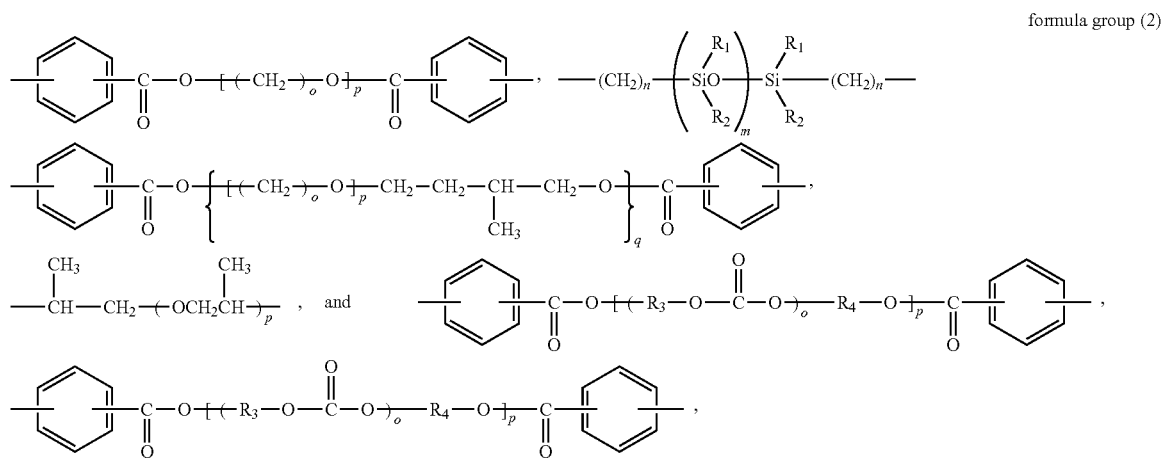

wherein o, p, and q each independently represent an integer of 1 to 30, $R_1$ and $R_2$ each independently represent an alkyl group having 1 to 12 carbon atoms or an aromatic group, m represents an integer of 1 to 40, n represents an integer of 1 to 20, and $R_3$ and $R_4$ each independently represent an alkylene group having 1 to 12 carbon atoms.

4. The polyimide precursor composition according to claim 1, wherein the R" in formula (2) above is a divalent organic group selected from formula group (3) below:

formula group (3)

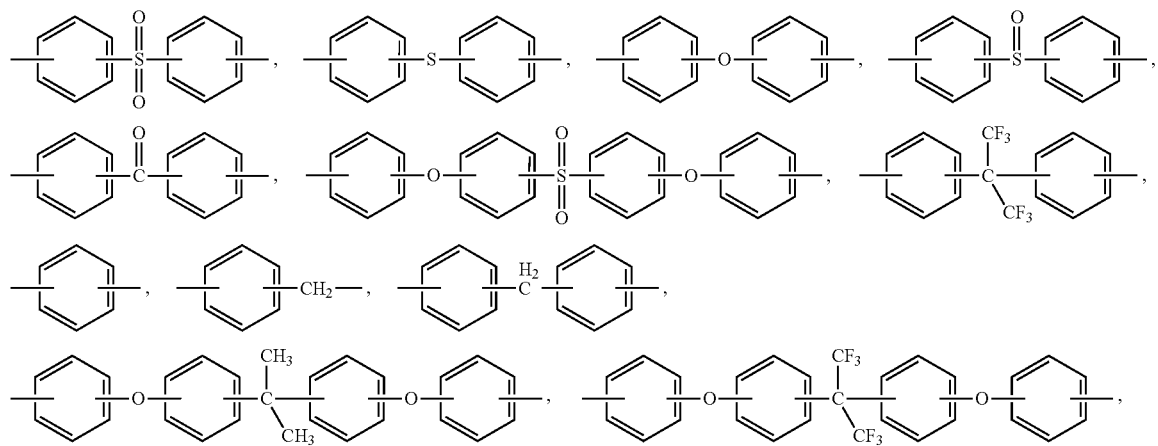

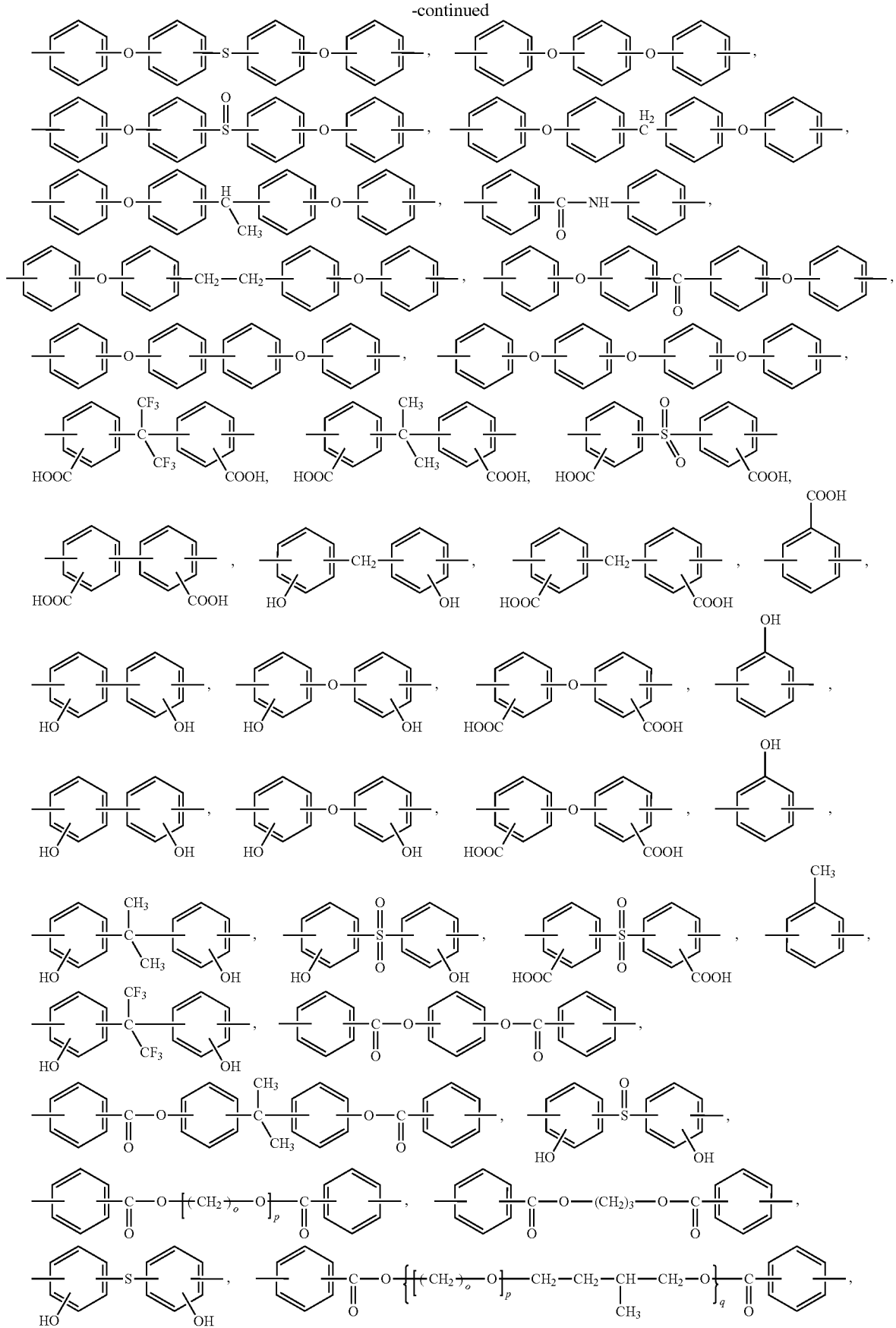

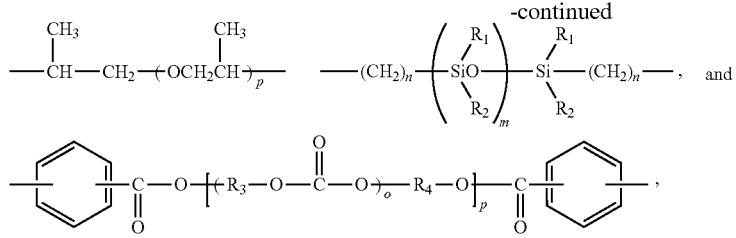

wherein o, p, and q each independently represent an integer of 1 to 30, $R_1$ and $R_2$ each independently represent an alkyl group having 1 to 12 carbon atoms or an aromatic group, m represents an integer of 1 to 40, n represents an integer of 1 to 20, and $R_3$ and $R_4$ each independently represent an alkylene group having 1 to 12 carbon atoms.

5. A polyimide precursor composition solution produced by dissolving the polyimide precursor composition according to claim 1 so that a solute concentration is 40 to 90 weight percent.

6. A polyimide coating film obtained from the polyimide precursor composition according to claim 1 or a polyimide precursor composition solution produced by dissolving the polyimide precursor composition according to claim 1 so that a solute concentration is 40 to 90 weight percent.

7. A printed wiring board having a polyimide coating film, the printed wiring board produced by coating the polyimide precursor composition according to claim 1 or a polyimide precursor composition solution produced by dissolving the polyimide precursor composition according to claim 1 so that a solute concentration is 40 to 90 weight percent on a printed wiring board, and imidizing by heating.

8. A photosensitive resin composition comprising the polyimide precursor composition according to claim 1, and at least a photosensitive resin, and a photopolymerization initiator.

9. A method of producing a polyimide precursor composition according to claim 1 comprising steps of:
conducting a reaction between a tetracarboxylic dianhydride represented by formula (3) below:

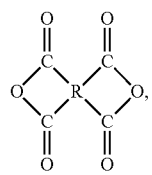 formula (3)

wherein R represents a tetravalent organic group, and a diamine represented by formula (4) below:

$$H_2N-R'-NH_2 \qquad \text{formula (4)},$$

wherein R' represents a divalent organic group, in a ratio in which the diamine represented by the formula (4) is 0.20 to 0.80 moles relative to 1 mole of the tetracarboxylic dianhydride represented by the formula (3) to prepare an amic acid;

imidizing the amic acid to prepare an imide; and reacting the imide with water so as to prepare an imidized tetracarboxylic acid, an inner part of which is imidized and each terminal of which has a tetracarboxylic acid structure, wherein the method further comprises a step of mixing the imidized tetracarboxylic acid prepared in the above step with a diamine represented by formula (2) below:

$$H_2N-R''-NH_2 \qquad \text{formula (2)},$$

wherein R'' represents a divalent organic group, in a ratio in which a total of the diamine represented by the formula (2) and the diamine represented by the formula (4) used in the step of preparing the amic amid is 0.70 to 1.30 moles relative to 1 mole of the imidized tetracarboxylic acid.

10. The method of producing a polyimide precursor composition according to claim 9, wherein the diamine represented by the formula (4) at least includes a diamine represented by formula group (4) below:

formula group (4)

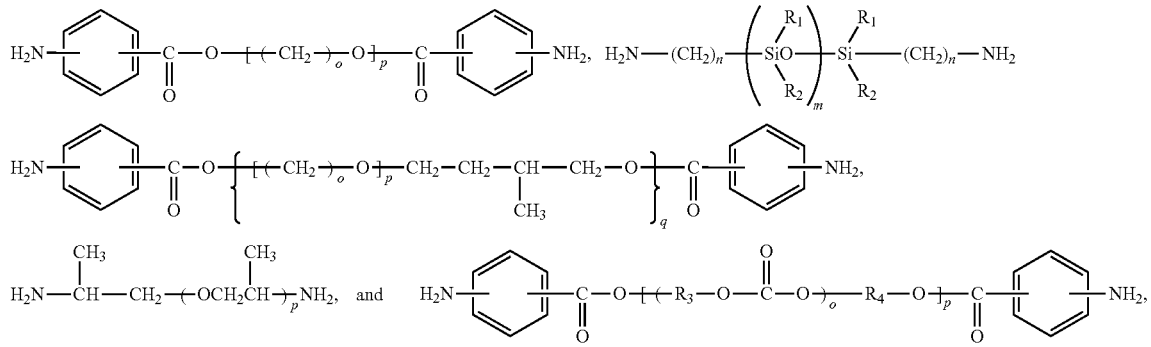

-continued

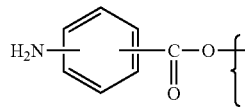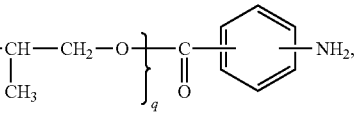

wherein o, p, and q each independently represent an integer of 1 to 30, $R_1$ and $R_2$ each independently represent an alkyl group having 1 to 12 carbon atoms or an aromatic group, m represents an integer of 1 to 40, n represents an integer of 1 to 20, and $R_3$ and $R_4$ each independently represent an alkylen group having 1 to 12 carbon atoms.

11. A method of producing a polyimide precursor composition solution comprising a step of dissolving the polyimide precursor composition produced by the method according to claim 9 in an organic solvent so that a solute concentration is 40 to 90 weight percent.

12. A method of producing a polyimide coating film comprising a step of obtaining a polyimide coating film from the polyimide precursor composition produced by the method according to claim 9 or a polyimide precursor composition solution produced by a method of dissolving the polyimide precursor composition produced by the method according to claim 9 in an organic solvent so that a solute concentration is 40 to 90 weight percent.

13. A method of producing a printed wiring board having a polyimide coating film, comprising steps of coating the polyimide precursor composition produced by the method according to claim 9 or a polyimide precursor composition solution produced by a method of dissolving the polyimide precursor composition produced by the method according to claim 9 in an organic solvent so that a solute concentration is 40 to 90 weight percent on a printed wiring board, and imidizing by heating.

14. A method of producing a photosensitive resin composition comprising a step of mixing the polyimide precursor composition produced by the method according to claim 9 with at least a photosensitive resin, and a photopolymerization initiator.

* * * * *